United States Patent
Okamoto et al.

(10) Patent No.: US 6,784,718 B2
(45) Date of Patent: Aug. 31, 2004

(54) SEMICONDUCTOR DEVICE ADAPTABLE TO A PLURALITY OF KINDS OF INTERFACES

(75) Inventors: Takeo Okamoto, Hyogo (JP); Tadaaki Yamauchi, Hyogo (JP); Shinichi Jinbo, Hyogo (JP); Makoto Suwa, Hyogo (JP); Junko Matsumoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/231,132

(22) Filed: Aug. 30, 2002

(65) Prior Publication Data

US 2003/0080795 A1 May 1, 2003

(30) Foreign Application Priority Data

Oct. 29, 2001 (JP) ........................................ 2001-330950

(51) Int. Cl.$^7$ ................................................. H03L 5/00
(52) U.S. Cl. ........................... 327/333; 327/77; 326/63; 326/80
(58) Field of Search ......................... 327/333, 374–377, 327/50–53, 56, 72, 77, 89; 326/63, 68, 70–72, 80–83; 365/189.07, 189.11, 196

(56) References Cited

U.S. PATENT DOCUMENTS

| 6,043,699 | A | * | 3/2000 | Shimizu | 327/333 |
| 6,097,214 | A | * | 8/2000 | Troussel et al. | 326/63 |
| 6,275,070 | B1 | * | 8/2001 | Pantelakis et al. | 326/98 |
| 6,340,902 | B1 | * | 1/2002 | Kato | 327/77 |
| 6,384,631 | B1 | * | 5/2002 | Wert et al. | 326/68 |
| 6,426,908 | B1 | | 7/2002 | Hidaka | 365/222 |
| 6,433,523 | B2 | * | 8/2002 | Hashimoto | 323/282 |

FOREIGN PATENT DOCUMENTS

TW                  448623           8/2001

* cited by examiner

*Primary Examiner*—Minh Nguyen
(74) *Attorney, Agent, or Firm*—McDermott Will & Emery LLP

(57) ABSTRACT

An input circuit includes a gate circuit receiving an output power supply voltage that determines the logic level of an input signal or a comparison circuit receiving an input signal and a reference voltage depending on the output power supply voltage supplied from a pad different from a power supply pad for an output circuit. Even if the output power supply voltage varies to cause the input signal to change, whether the input signal is at H level or L level can accurately be determined and an internal signal is generated correctly

3 Claims, 11 Drawing Sheets

SEMICONDUCTOR DEVICE ADAPTABLE TO A PLURALITY OF KINDS OF INTERFACES

BACKGROUND OF THE INVENTION

1. Field of the Invention

The present invention relates to semiconductor devices. In particular, the invention relates to a configuration of an input circuit adaptable to multiple types of interfaces. More specifically, the invention relates to a configuration of an input circuit of a synchronous semiconductor device operating in synchronization with a clock signal.

2. Description of the Background Art

FIG. 18 schematically shows an exemplary configuration of a conventional input circuit. Referring to FIG. 18, input circuit 902 includes a comparison circuit 902a for comparing an externally supplied signal EXSI with a reference voltage VREF to generate a signal according to a result of comparison, and an inverter 902b buffering (amplifying) the output signal from comparison circuit 902a to generate internal signal INSI. Comparison circuit 902a and inverter 902b receive internal power supply voltage VDDP as an operating power supply voltage.

Reference voltage VREF is generated by a reference voltage generation circuit 900. Reference voltage generation circuit 900 includes a constant current source 900a, connected to an external power supply node which receives external power supply voltage EXVDD, for generating a constant current of a constant magnitude, and a current/voltage converting element (Z) 900b converting the constant current supplied from constant current source 900a into a voltage to generate reference voltage VREF on a node 900c. Current/voltage converting element 900b is constituted of a resistance element or a MOS transistor (insulated gate field effect transistor) having a gate and a drain connected together, for example.

FIG. 19 is a signal waveform diagram representing an operation of the input circuit shown in FIG. 18. The operation of the input circuit shown in FIG. 18 is now described briefly with reference to FIG. 19.

Comparison circuit 902a has a negative input receiving external signal EXSI and a positive input receiving reference voltage VREF to function as a differential amplifier circuit.

When external signal EXSI is higher than reference voltage VREF, the output signal from comparison circuit 902a is at a low level according to the difference in between. Inverter 902b amplifies and inverts the low level signal from comparison circuit 902a to output the resultant signal, and thus internal signal INSI attains a logical high level (hereinafter H level) at the level of internal power supply voltage VDDP.

When external signal EXSI is lower than reference voltage VREF, comparison circuit 902a outputs a high level signal according to the difference in between. Inverter 902b inverts and amplifies the output signal from comparison circuit 902a, and thus internal signal INSI attains a logical low level (hereinafter L level) at the ground voltage level.

In this way, internal signal INSI has its logic level quickly changeable each time external signal EXSI crosses reference voltage VREF. Thus, the internal signal having a waveform with sharp rising/falling can be generated. In other words, with this differential amplifier circuit 902a, external signal EXSI is compared with reference voltage VREF to generate internal signal INSI according to a result of comparison, so that an internal signal having a sharp rising/falling can be generated even if external signal EXSI is distorted in waveform.

Reference voltage VREF is set to a voltage level according to the amplitude of the external signal, or the intermediate level of the amplitude of external signal EXSI. For example, if external signal EXSI is 1.8 V (=VDDQ), reference voltage VREF is set at 0.9 V.

FIG. 20 schematically shows a relation between the logical high level (H level) and the logical low level (L level) of external signal EXSI and the reference voltage. Referring to FIG. 20, the lower limit of H level of external signal EXSI is the level of voltage VIH while the upper limit of L level thereof is the level of voltage VIL. In general, for an LVTTL (Low Voltage Transistor Transistor Logic) interface, the lower limit voltage of H level, VIH, is set at 2.0 V, and the upper limit voltage of L level, VIL, is set at 0.8 V. Accordingly, for this LVTTL interface, reference voltage VREF is set at the intermediate value in between, i.e., 1.4 V.

However, for a recent 1.8 V interface used for transferring signal/data by means of an output circuit of a low power supply voltage, the H level lower limit voltage VIH is set at the voltage level of 0.8·VDDQ and the L level upper limit voltage VIL is set at the voltage level of 0.2·VDDQ, where VDDQ represents an operating power supply voltage of a circuit driving the external signal EXSI. In this case, reference voltage VREF has its voltage level set at the intermediate value, i.e., 0.9 V.

Referring back to FIG. 18, reference voltage VREF is generated through conversion of the constant current from constant current source 900a into voltage by current/voltage converting element 900b. Reference voltage VREF thus has a constant voltage level which is independent of voltage VDDQ. Power supply voltage VDDQ is allowed to vary within the range from 1.65 V to 1.95 V in the specification value.

Referring to FIG. 21A, when power supply voltage VDDQ increases to 1.95 V, H level lower limit voltage VIH of external signal EXSI attains 1.56 V while L level upper limit voltage VIL thereof attains 0.36 V. Reference voltage VREF is constant at 0.9 V, so that the difference between reference voltage VREF and H level lower limit voltage VIH is 0.66 V while the difference between reference voltage VREF and L level upper limit voltage VIL is 0.54 V. Accordingly, there is a difference between the time required for external signal EXSI of H level to change toward L level to cross reference voltage VREF and the time required for external signal EXSI of L level to change toward H level to cross reference voltage VREF. Consequently, the response of the internal signal to the falling of the external signal is delayed.

Referring to FIG. 21B, when power supply voltage VDDQ decreases to 1.65 V, H level lower limit voltage VIH attains 1.32 V while L level upper limit voltage VIL transitions to 0.32 V. Reference voltage VREF is also 0.9 V, and thus the difference between H level lower limit voltage VIH and reference voltage VREF is 0.42 V while the difference between reference voltage VREF and L level upper limit voltage VIL is 0.58 V. Consequently, the response of the internal signal to rising of the external signal is delayed.

Specifically, as shown with some exaggeration in FIG. 22A, when power supply voltage VDDQ increases, the response of internal signal INSI to the falling of external signal EXSI is delayed and the response thereof to the rising of external signal EXSI is advanced. Thus, the period during which internal signal INSI is at H level is shorter than that of an ideal response waveform indicated by the dotted line in FIG. 22A.

In contrast, as shown in FIG. 22B, when the power supply voltage VDDQ decreases, the level of reference voltage VREF relatively increases. Then, the response of internal signal INSI to the falling of external signal EXSI is advanced while the response thereof to the rising of external signal EXSI is delayed. Consequently, the period of H level of internal signal INSI is longer than that of an ideal response waveform indicated by the dotted line in FIG. 22B.

In other words, the variation in the level of power supply voltage VDDQ which defines H level of external signal EXSI causes delay in the rising or falling response of internal signal INSI, resulting in a problem that an internal signal responding accurately to change of an external signal cannot be generated.

It is considered that external signal EXSI changes between H level lower limit voltage VIH and L level upper limit voltage VIL due to a propagation loss of a signal transmission line. Then, the difference between H level lower limit voltage VIH and reference voltage VREF would become different from that between L level upper limit voltage VIL reference voltage when external power supply voltage VDDQ varies. In this case, an input circuit has different operating margins for the H level and LOW level voltages, respectively. Consequently, a sufficient operating margin cannot be ensured and a problem arises accordingly that an internal signal corresponding accurately to an external signal cannot be generated.

In particular, power supply voltage VDDQ is used for an operating power supply voltage of a signal/data output circuit. Therefore, if the operating power supply voltage of an output circuit on the transmission side varies in outputting of a signal/data, there is caused an increased variation in the voltage level of the input signal of a semiconductor memory device on the reception side. Consequently, there arises a problem that it is difficult to accurately determine the logic level of an input signal to generate an internal signal according to the input signal.

Depending on processing systems, there may be a case where different interfaces are used. Such systems include a system transferring signal/data in accordance with an LVTTL interface and a system transferring signal/data in accordance with a 1.8 V system interface as described above. If chips are separately and individually designed for such plurality of interfaces, the design efficiency would deteriorate. Therefore, in general, a common chip design is employed for a plurality of interfaces and the level of the reference voltage is finally set according to an interface to be practically employed.

Even when such a plurality of interfaces include an interface receiving an input signal which has an H level lower limit voltage and an L level upper limit voltage that depend on a power supply voltage level as described above, it is still required to determine the logic level of the input signal accurately regardless of variations of the power supply voltage without affecting an processing speed of an internal signal.

SUMMARY OF THE INVENTION

An object of the present invention is to provide an input circuit capable of generating an internal signal in accurate and stable manner even if a power supply voltage which defines the amplitude of an external signal varies.

Another object of the invention is to provide an input circuit readily adaptable to a plurality of types of interfaces and capable of accurately determining the logic level of an input signal without deterioration in signal processing speed.

A semiconductor device according to a first aspect of the present invention includes a reference voltage generation circuit generating a reference voltage, from a first power supply voltage supplied from a first power supply pad, depending on the first power supply voltage, a first input circuit receiving a first input signal and determining a logic level of the first input signal according to a relation between the voltage levels of the reference voltage and the first input signal to generate a first internal signal at a level of a second power supply voltage different from the first power supply voltage according to a result of determination, and an output circuit receiving, from a second power supply pad provided separately from the first power supply pad, the first power supply voltage as an operating power supply voltage to buffer a received signal for external output.

A semiconductor device according to a second aspect of the present invention includes a gate circuit receiving a first power supply voltage as an operating power supply voltage for buffering an input signal and generating an output signal having an amplitude corresponding to a level of the first power supply voltage, and a level conversion circuit for converting the output signal generated by the gate circuit into a signal having an amplitude corresponding to a level of the second power supply voltage to generate an internal signal. The input signal has its logic level determined by a voltage depending on a second power supply voltage.

A semiconductor device according to a third aspect of the present invention includes a first clock input circuit receiving a first power supply voltage as an operating power supply voltage, and comparing an externally supplied external clock signal with a first reference voltage and generating an internal clock signal corresponding to the external clock signal according to a result of the comparison when activated, a second clock input circuit receiving a second power supply voltage as an operating power supply voltage, and comparing the external clock signal with a second reference voltage and generating a second internal clock signal corresponding to the external clock signal according to a result of the comparison, a first clock control circuit for generating a first clock control signal to activate the first clock input circuit in accordance with the clock signal and a clock enable signal instructing whether the clock signal is valid or invalid, and a second clock control circuit for generating a second clock control signal to activate the second clock input circuit in accordance with the external clock signal and the clock enable signal.

The logic level of the first input signal is determined according to a relation between the voltage levels of the reference voltage depending on the first power supply voltage and the first input signal. Even if the level of the first power supply voltage varies, the internal signal can accurately be generated regardless of the variation of the first power supply voltage level, since the logic level of the input signal is determined based on the first power supply voltage.

With respect to clock signals, a plurality of circuit systems are provided according to available levels of the power supply voltage. According to a level of the power supply voltage, a corresponding clock signal generation circuit system is activated. Even if the external power supply voltage is changed to accompany a change in the amplitude of the clock signal, an internal clock signal can accurately and readily be generated according to the external clock signal.

The foregoing and other objects, features, aspects and advantages of the present invention will become more apparent from the following detailed description of the

DESCRIPTION OF THE PREFERRED EMBODIMENTS

Whole Configuration

Figure 1:
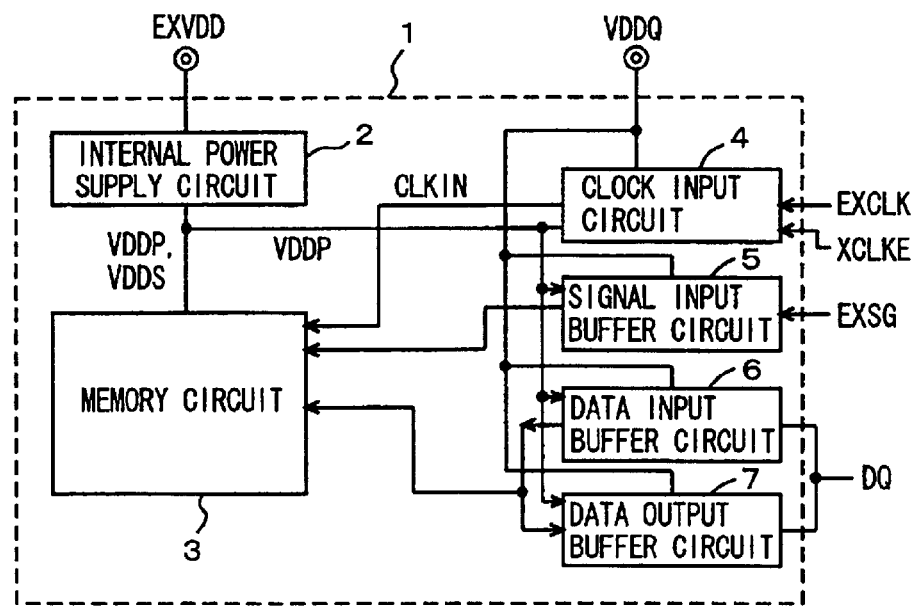
FIG. 1 schematically shows a whole configuration of a semiconductor device according to the present invention.

FIG. 1 schematically shows the whole configuration of a semiconductor device according to the present invention. Referring to FIG. 1, semiconductor device 1 includes an internal power supply circuit 2 generating various internal power supply voltages from external power supply voltage EXVDD, and a memory circuit 3 receiving from internal power supply circuit 2 internal power supply voltages as its operating power supply voltages. FIG. 1 shows peripheral power supply voltage VDDP and array power supply voltage VDDS as representatives of the internal power supply voltages generated by internal power supply circuit 2. Memory circuit 3 includes a memory cell array including memory cells arranged in rows and columns and a memory selection circuit for selecting a memory cell from this memory cell array. Array power supply voltage VDDS is supplied to the memory cell array and peripheral power supply voltage VDDP is supplied to circuitry for selecting a memory cell.

Semiconductor device 1 further includes a clock input circuit 4 receiving external clock signal EXCLK and external clock enable signal XCLKE instructing whether the clock signal is valid/invalid to generate internal clock signal CLKIN, a signal input buffer circuit 5 generating an internal signal according to an external signal EXSG, a data input buffer circuit 6 receiving externally supplied input data to generate internal data, and a data output buffer circuit 7 externally outputting data read from a selected memory cell in memory circuit 3.

FIG. 1 shows that data input buffer circuit 6 and data output buffer circuit 7 input/output data via a common terminal (pad). However, data input buffer circuit 6 and data output buffer circuit 7 may input/output data via different terminals (pads).

Clock input circuit 4, signal input buffer circuit 5, data input buffer circuit 6 and data output buffer circuit 7 are supplied with externally supplied output power supply voltage VDDQ and peripheral power supply voltage VDDP which is supplied from internal power supply circuit 2.

According to output power supply voltage VDDQ, each amplitude of data DQ, external signal EXSG, external clock signal EXCLK and external clock enable signal XCLKE is determined. Specifically, according to an interface which is applied to this semiconductor device 1, the voltage level of output power supply voltage VDDQ is determined. Output power supply voltage VDDQ is supplied to clock input circuit 4, signal input buffer circuit 5, data input buffer circuit 6 and data output buffer circuit 7, and an internal signal is generated according to a voltage relation between output power supply voltage VDDQ and an externally applied signal (including data). Thus, even if output power supply voltage VDDQ varies or the power supply voltage level is changed according to the applied interface, the internal signal can accurately be generated by determining the logic level of the external signal.

First Embodiment

Figure 2:
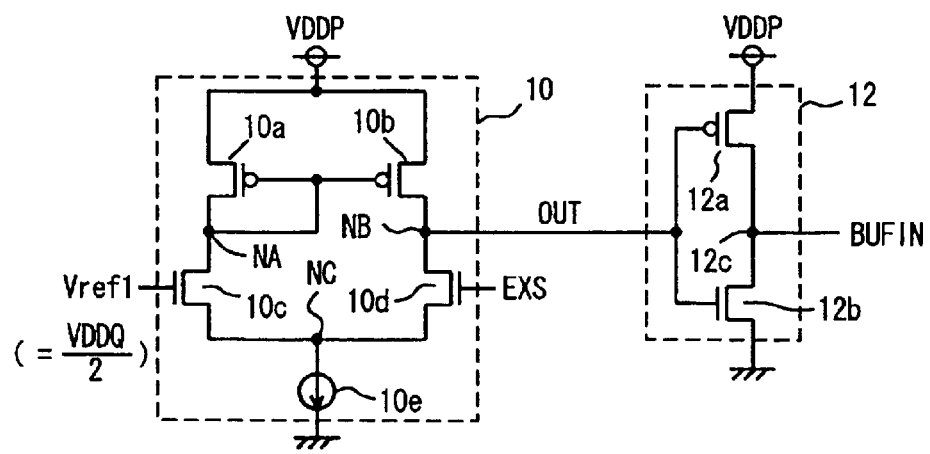
FIG. 2 shows a configuration of an input circuit according to a first embodiment of the present invention.

FIG. 2 shows a configuration of an input buffer circuit according to a first embodiment of the present invention. FIG. 2 shows the configuration of an input buffer circuit at a first stage of each of clock input circuit 4, signal input buffer circuit 5, and data input circuit 6 shown in FIG. 1 in common. The first stage input buffer circuit buffers signal/data externally applied via a pad to generate an internal signal.

Referring to FIG. 2, the input buffer circuit includes a comparison circuit 10 for comparing reference voltage Vref1 with the voltage level of external signal EXS to generate signal OUT indicating a result of the comparison, and an inverter buffer 12 for buffering output signal OUT from comparison circuit 10 to generate internal signal BUFIN. These comparison circuit 10 and inverter buffer 12 receive peripheral power supply voltage VDDP as their operating power supply voltage. Reference voltage Vref1 has a voltage level which is half an output power supply voltage VDDQ, and depends on output power supply voltage VDDQ.

Comparison circuit 10 includes a P channel MOS transistor (insulated gate field effect transistor) 10a connected between a power supply node and an internal node NA and having its gate connected to internal node NA, a P channel MOS transistor 10b connected between the supply node and an internal node NB and having its gate connected to internal node NA, an N channel MOS transistor 10c connected between internal nodes NA and NC and receiving, at its gate, reference voltage Vref1, an N channel MOS transistor 10d connected between internal nodes NB and NC and receiving, at its gate, external signal EXS, and a constant current source 10e connected between internal node NC and a ground node. Constant current source 10e decides an operating current of comparison circuit 10.

In comparison circuit 10, MOS transistors 10a and 10b constitute a current mirror stage so that the mirror current of a current flowing through MOS transistor 10a flows through MOS transistor 10b. If these MOS transistors 10a and 10b have the same size (channel width to channel length ratio), current of the same magnitude flows through MOS transistors 10a and 10b.

MOS transistors 10c and 10d constitute a differential stage to generate, on internal node NB, a signal according to the difference between reference voltage Vref1 and the voltage level of external signal EXS. For example, if external signal EXS is higher in voltage level than reference voltage Vref1, MOS transistor 10d has a larger conductance so that the current flowing through MOS transistor 10d is larger in amount than that flowing through MOS transistor 10c. MOS transistor 10c receives current from MOS transistor 10a. Therefore, MOS transistor 10d discharges the current supplied from MOS transistor 10b and output signal OUT from node NB goes low.

If external signal EXS is lower in voltage level than reference voltage Vref1, MOS transistor 10c has its conductance made larger than the conductance of MOS transistor 10d, so that the amount of current flowing through MOS transistor 10c is made greater than that flowing through MOS transistor 10d. Since the mirror current of the current flowing through MOS transistor 10c is supplied to MOS transistor 10d via the current mirror stage of MOS transistors 10a and 10b, MOS transistor 10d cannot discharge all of the supplied current. Therefore, output signal OUT from node NB goes high.

Inverter buffer 12 includes a P channel MOS transistor 12a connected between the power supply node and a node 12c and receiving, at its gate, output signal OUT from comparison circuit 10 and an N channel MOS transistor 12b connected between node 12c and the ground node and receiving, at its gate, output signal OUT from comparison circuit 10.

Inverter buffer 12 amplifies and inverts output signal OUT to generate internal signal BUFIN. Thus, if output signal OUT from comparison circuit 10 is at an intermediate voltage level, but exceeds an input logic threshold voltage of inverter buffer 12, internal signal BUFIN is speedily driven to a voltage level according to the logic level of output signal OUT from comparison circuit 10. Internal signal BUFIN has an amplitude corresponding to internal power supply voltage VDDP. Accordingly, with the circuitry shown in FIG. 2, external signal EXS with an amplitude of VDDQ is level-converted to the signal of amplitude VDDP.

Reference voltage Vref1 has a voltage level at a half of output power supply voltage VDDQ. If output power supply voltage VDDQ varies, external signal EXS, which is generated by a circuit using the common output power supply voltage VDDQ, has its voltage level varied accordingly. Reference voltage Vref1 thus always varies according to variation of output power supply voltage VDDQ. Even if the voltage level of output power supply voltage VDDQ changes, reference voltage Vref1 is kept at the intermediate value between H level lower limit voltage VIH (hereinafter referred to as HIGHIGH level voltage) of external signal EXS and L level upper limit voltage VIL (hereinafter referred to as LOW level voltage). Regardless of change of output power supply voltage VDDQ, the logic level of external signal EXS can accurately be determined. In addition, the same operating margin is always ensured with respect to both of HIGH level voltage VIH and LOW level voltage VIL.

External signal EXS may be any of the signals shown in FIG. 1.

Figure 3:
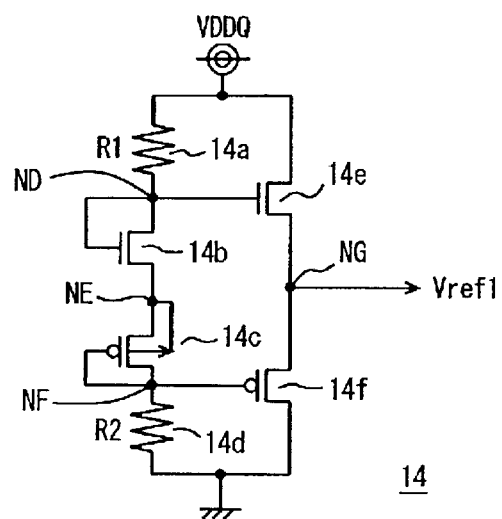
FIG. 3 exemplarily shows a configuration of a circuit for generating a reference voltage according to the first embodiment of the invention.

FIG. 3 shows, by way of example, a configuration of a circuit 14 which generates reference voltage Vref1 shown in FIG. 2. Referring to FIG. 3, reference voltage generation circuit 14 includes a resistance element 14a connected between an output power supply node and a node ND, an N channel MOS transistor 14b connected between nodes ND and NE and having its gate connected to node ND, a P channel MOS transistor 14c connected between nodes NE and NF and having its gate connected to node NF, a resistor element 14d connected between node NF and the ground node, an N channel MOS transistor 14e connected between the output power supply node and a node NG and having its gate connected to node ND, and a P channel MOS transistor 14f connected between node NG and the ground node and having its gate connected to node NF. To the output power supply node of the reference voltage generator 14, output power supply voltage VDDQ is supplied via a pad different from the pad which supplies an operating power supply voltage to an output circuit and others, in order to generate the reference voltage in a stable manner without being affected by any variation in output power supply voltage VDDQ when the output circuit operates.

Respective resistance values of resistance elements 14a and 14d are R1 and R2, which are sufficiently greater than the channel resistance (ON resistance) of MOS transistors 14b and 14c. In this state, MOS transistors 14b and 14c each operate in a diode mode to cause a voltage drop corresponding to the absolute value of a threshold voltage thereof in a forward direction. When resistance values R1 and R2 of resistance elements 14a and 14d are equal to each other, voltage V (ND) and voltage V (NF) respectively on nodes ND and NF are represented by the following equations:

$$V(ND) = (VDDQ/2) + Vthn, \text{ and}$$

$$V(NF) = (VDDQ/2) - |Vthp|,$$

where Vthn and Vthp indicate respective threshold voltages of MOS transistors 14b and 14c.

MOS transistor 14e, lower in gate voltage than the voltage on the drain node, i.e., output power supply voltage VDDQ, operates in a source-follower mode to transmit, to node NG, a voltage that is lower than voltage V (ND) on node ND by threshold voltage Vthn. Therefore, the voltage represented by (VDDQ/2) is transmitted to node NG by this MOS transistor 14e.

On the other hand, MOS transistor 14f, lower in drain node voltage than its gate voltage or the voltage on node NF, operates similarly in the source-follower mode. MOS transistor 14f thus transmits to node NG the voltage higher than voltage V (NF) on node NF by the absolute value |Vthp| of its threshold voltage, i.e., the voltage represented by (VDDQ/2). Here, it is assumed that the threshold voltages of MOS transistors 14c and 14f are equal to each other and the threshold voltages of MOS transistors 14b and 14e are equal to each other.

When reference voltage Vref1 is lower than voltage (VDDQ/2), the gate-source voltage of MOS transistor 14e is greater than threshold voltage Vthn so that MOS transistor 14e is turned on to supply current to node NG and increase the level of reference voltage Vref1. When reference voltage Vref1 is higher than the voltage level of (VDDQ/2), the source-gate voltage of MOS transistor 14f is greater than the absolute value of the threshold voltage so that MOS transistor 14 is turned on and the voltage level of reference voltage Vref1 decreases. The source-follower mode operations of MOS transistors 14e and 14f allow the level of reference voltage Vref1 to be maintained at the level of (VDDQ/2).

In addition, reference voltage generation circuit 14 can generate intermediate voltage VDDQ/2with a minute amount of current by resistance elements 14a and 14d having a sufficiently large resistance values. In this case, it is merely required that reference voltage generation circuit 14 charges the gate capacitance of a differential stage of a differential amplifier circuit constituting the comparison circuit of the input buffer circuit. Therefore, it is possible that reference voltage generation circuit 14 can have MOS transistors 14e and 14f in made sufficiently small in size and power consumption made sufficiently low.

As described above, according to the first embodiment, the reference voltage is generated according to the power supply voltage which determines the logic level of the external signal, and, this reference voltage and the external signal are compared with each other. Thus, even when the output power supply voltage varies, or when the amplitude of the external signal changes (voltage level changes), the reference voltage can be maintained accurately at the intermediate voltage level between the HIGH and LOW level voltages of the varying external signal. The logic level of the external signal can thus be determined correctly.

Moreover, margins of reference voltage Vref1 for HIGH level voltage VIH and for LOW level voltage VIL of the external signal can be made equal to each other even if the output power supply voltage varies. Therefore, the same margins of the reference voltage can always be ensured for both of HIGH level voltage VIH and LOW level voltage VIL and the logic level of the external signal can be determined in a stable manner.

Second Embodiment

Figure 4:
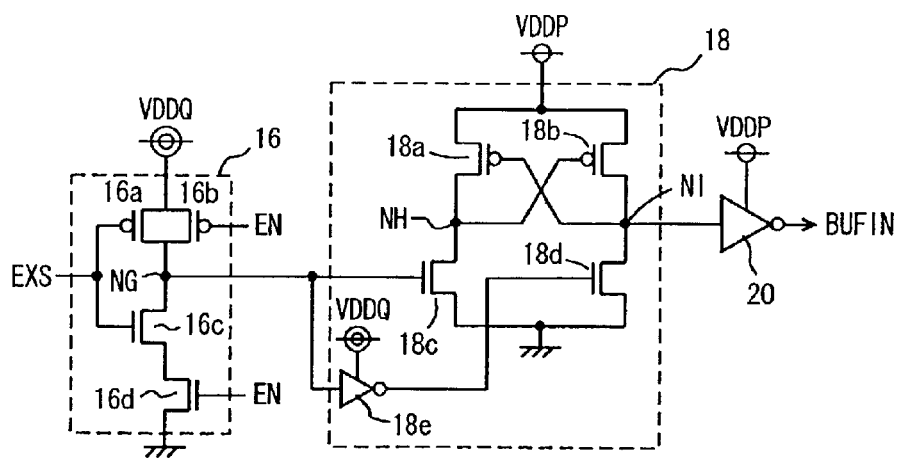
FIG. 4 shows a configuration of an input circuit according to a second embodiment of the present invention.

FIG. 4 shows a configuration of an input circuit according to a second embodiment of the present invention. FIG. 4 also shows the configuration of an input buffer circuit which receives one external signal EXS to generate internal signal BUFIN. Referring to FIG. 4, the input buffer circuit includes an inverter buffer 16 receiving external signal EXS to generate a signal having an amplitude corresponding to the level of output power supply voltage VDDQ, a level conversion circuit 18 converting the output signal from inverter buffer 16 into a signal with an amplitude corresponding to the level of internal power supply voltage VDDP, and an inverter buffer 20 buffering (amplifying) the output signal from level conversion circuit 18 to generate internal signal BUFIN.

Inverter buffer 16 receives output power supply voltage VDDQ as its operating power supply voltage, and level conversion circuit 18 and inverter buffer 20 receive internal power supply voltage VDDP as their operating power supply voltage. External signal EXS is received by inverter buffer 16 supplied with output power supply voltage VDDQ as the operating power supply voltage. The input logic threshold of inverter buffer 16 is set at the voltage level of VDDQ/2. Therefore, even if the amplitude of external signal EXS changes according to a change of output power supply voltage VDDQ, the input logic threshold voltage can always be maintained at the voltage level of VDDQ/2. Regardless of variation of power supply voltage VDDQ, the logic level of external signal EXS can accurately be determined.

The output signal from inverter buffer 16 is converted by level conversion circuit 18 into the signal of the level of internal power supply voltage VDDP, and internal signal BUFIN of the level of internal power supply voltage VDDP is generated by inverter buffer 20. Thus, the internal signal can be generated which is at a voltage level according to the operating power supply voltage of internal circuitry.

Inverter buffer 16 includes a P channel MOS transistor 16a connected between an output power supply node and an internal node NG and having a gate receiving external signal EXS, a P channel MOS transistor 16b connected between the output power supply node and node NG and having a gate receiving enable signal EN, and N channel MOS transistors 16c and 16d connected in series between node NG and a ground node.

MOS transistor 16c receives, at its gate, external signal EXS while MOS transistor 16d receives, at its gate, enable signal EN. Enable signal EN is inactivated in a power down mode. When enable signal EN is inactive, MOS transistor 16b is in ON state (conductive state) and MOS transistor 16d is in OFF state (non-conductive state). Accordingly, node NG is kept at the level of output power supply voltage VDDQ. Thus, the operation of inverter buffer 16 can be stopped regardless of any change of external signal EXS when the enable signal EN is inactive, to reduce the current consumption in low power consumption mode such as the power down mode.

Level conversion circuit 18 includes a P channel MOS transistor 18a connected between the internal power supply node and an internal node NH and having a gate connected to an internal node NI, a P channel MOS transistor 18b connected between the internal power supply node and internal node NI and having a gate connected to internal node NH, an N channel MOS transistor 18c connected between internal node NH and the ground node and having a gate receiving the output signal from inverter buffer 16, and an N channel MOS transistor 18d connected between internal node NI and the ground node and having a gate receiving the output signal from inverter buffer 16 via an inverter 18e. Inverter 18e receives output power supply voltage VDDQ as its operating power supply voltage.

In this level conversion circuit 18, when the output signal from inverter buffer 16 attains H level, the output signal from inverter 18e attains L level and MOS transistors 18c and 18d are respectively in ON and OFF states. With decrease of the voltage on node NH, MOS transistor 18b transitions to ON state to raise the voltage on node NI to the level of internal power supply voltage VDDP. With this increase of the voltage level on internal node NI, MOS transistor 18a turns into a non-conductive state. Finally, internal node NI attains a voltage level corresponding to the level of internal power supply voltage VDDP, and internal node NH attains a voltage level corresponding to the ground voltage level. In this state, MOS transistor 18a is in OFF state and the signal of H level on node NI is latched by MOS transistors 18a and 18b and thus no current is consumed.

When the output signal from inverter buffer 16 is at L level, the output signal from inverter 18e is at H level so that MOS transistor 18c is in OFF state, while MOS transistor 18d is in ON state to drive internal node NI to the ground voltage level. With the decrease of voltage on internal node NI, MOS transistor 18a transitions to ON state to raise the voltage level on internal node NH. Finally, internal node NH attains a voltage level corresponding to internal power supply voltage VDDP and internal node NI attains the ground voltage level.

In this way, when inverter buffer 16 provides the output signal of L level, the L level signal is output from level conversion circuit 18. When inverter buffer 16 provides the output signal of output power supply voltage VDDQ level, level conversion circuit 18 outputs the signal of internal power supply voltage VDDP level.

By means of level conversion circuit 18, the signal of internal power supply voltage VDDP level is generated. The margins for H level and L level of the output signal from level conversion circuit 18 are ensured with respect to the input logic threshold voltage of inverter buffer 20, and internal signal BUFIN is speedily generated.

As discussed above, according to the second embodiment of the present invention, the externally applied signal is received by the inverter buffer, which receives the output power supply voltage as its operating power supply voltage, and the output signal from the inverter buffer is level-converted to generate the signal of the internal power supply voltage level. Thus, regardless of variation of output power supply voltage VDDQ, the margins for HIGH and LOW level voltages of external signal EXS can precisely be made equal to each other. The logic level of external signal EXS can reliably be determined to generate the internal signal.

Third Embodiment

Figure 5:
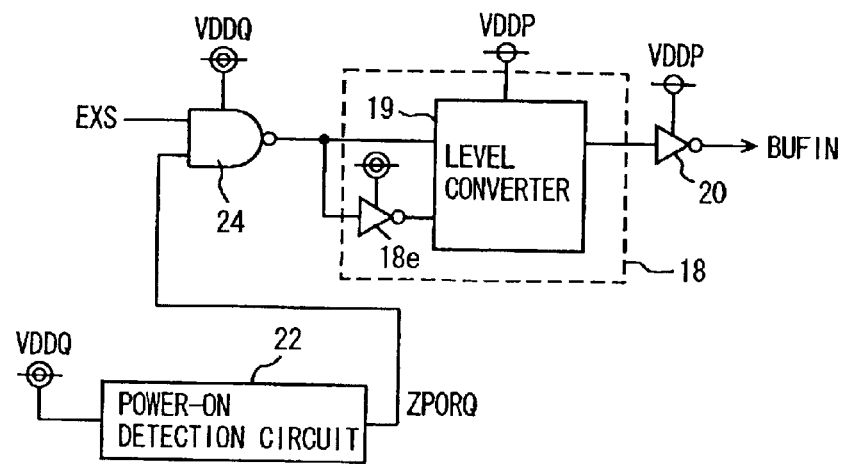
FIG. 5 schematically shows a configuration of an input circuit according to a third embodiment of the present invention.

FIG. 5 schematically shows a configuration of an input buffer circuit according to a third embodiment of the present invention. Referring to FIG. 5, the input buffer circuit includes a gate circuit 24 receiving external signal EXS and power-on detection signal ZPORQ from a power-on detection circuit 22, a level conversion circuit 18 for level-converting an output signal from gate circuit 24, and an inverter buffer 20 for buffering (amplifying) the output signal from level conversion circuit 18 to generate internal signal BUFIN.

Power-on detection circuit 22 raises the power-on detection signal ZPORQ to H level when output power supply voltage VDDQ is supplied and becomes stable. Power-on detection circuit 22 may be structured so as to detect power up of the power supply voltage, by raising the voltage level on an internal node through capacitive coupling of a capacitance element according to increase of the level of the power supply voltage, for example, as is done in a general power on detection circuit.

Gate circuit 24 is a NAND circuit and receives output power supply voltage VDDQ as its operating power supply voltage. Level conversion circuit 18 includes an inverter 18e for inverting the output signal from gate circuit 24 and a level converter 19 performing level conversion in accordance with the output signal from gate circuit 24 and the output signal from inverter 18e. The configuration of level converter 19 corresponds to the configuration which includes MOS transistors 18a–18d shown in FIG. 4.

Internal power supply voltage VDDP is generated from external power supply voltage EXVDD different from output power supply voltage VDDQ. Output power supply voltage VDDQ is externally supplied. Power supply voltages VDDQ and EXVDD are not always supplied simultaneously. In addition, the specification does not particularly define the power up sequence of these voltages. Therefore, there would be some cases that when external power supply voltage EXVDD is powered up prior to output power supply voltage VDDQ and internal power supply voltage VDDP rises first to become stable, output power supply voltage VDDQ is not supplied yet. In this case, if the first input stage is formed of a logic using output power supply voltage VDDQ, there would arise a malfunction as well as leakage in this first stage.

Therefore, as shown in FIG. 5, external signal EXS is combined with power-on detection signal ZPORQ supplied from power-on detection circuit 22 which detects the power up of output power supply voltage VDDQ. Accordingly, power-on detection signal ZPORQ from power-on detection circuit 22 is set at L level and the output signal from gate circuit 24 is fixed at the level of output power supply voltage VDDQ. It is thus possible to prevent leakage in the first input stage and malfunction, regardless of the voltage level of input signal EXS, even when external power supply voltage EXVDD is supplied first and output power supply voltage VDDQ is not supplied yet.

Figure 6:
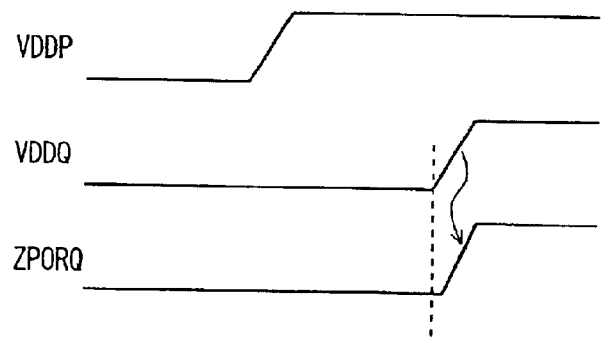
FIG. 6 is a signal waveform diagram representing an operation of a power-on detection circuit shown in FIG. 5.

Specifically, as shown in FIG. 6, when only external power supply voltage EXVDD is supplied and output power supply voltage VDDQ is not supplied, current leakage in the first input stage as well as a circuit malfunction can surely be avoided. Moreover, when output power supply voltage VDDQ is thereafter supplied, the rising characteristics of output power supply voltage VDDQ accompany no problem, and a normal operation can be effected.

Fourth Embodiment

Figure 7:
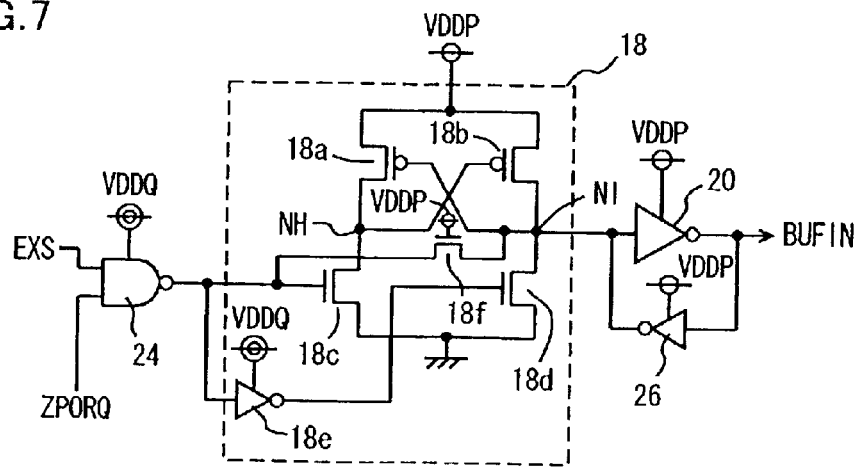
FIG. 7 shows a configuration of an input circuit according to a fourth embodiment of the present invention.

FIG. 7 schematically shows a configuration of an input buffer circuit according to a fourth embodiment of the present invention. The input buffer circuit in FIG. 7 differs from the input buffer circuit shown in FIG. 4 in the point that an inverter 26 with a relatively low driving ability is provided in parallel with inverter buffer 20. Inverter 26 receives internal power supply voltage VDDP as its operating power supply voltage. Inverter buffer 20 and inverter 26 constitute a latch circuit having a relatively low latching ability. The other components of the input buffer circuit shown in FIG. 7 are the same as corresponding ones of the input buffer circuit in FIG. 5, and corresponding components are denoted by the same reference characters and detailed description thereof is not repeated here.

Figure 8:
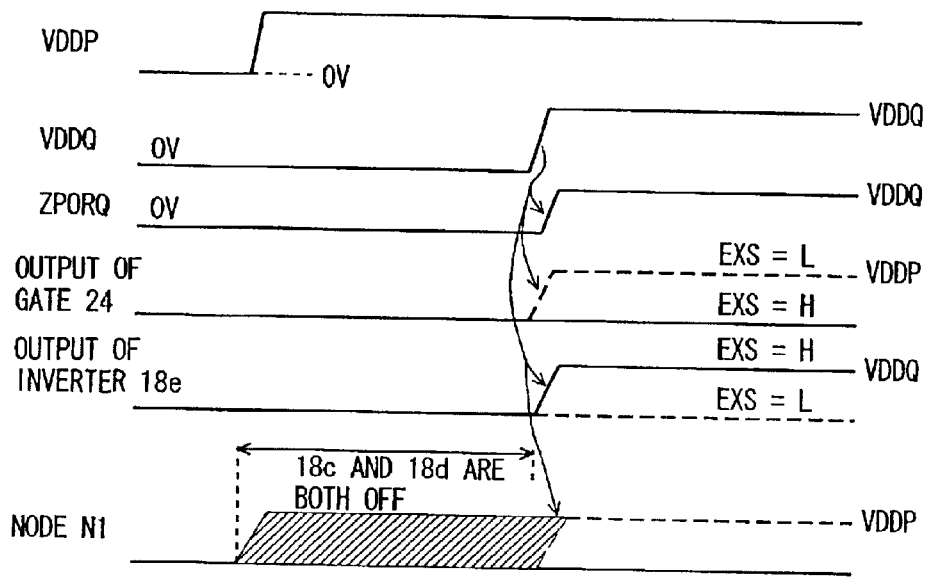
FIG. 8 is a signal waveform diagram representing an operation of the input circuit shown in FIG. 7.

FIG. 8 is a signal waveform diagram representing an operation of the input buffer circuit shown in FIG. 7. The operation of the input buffer circuit shown in FIG. 7 is now described with reference to FIG. 8.

External power supply voltage EXVDD is supplied or powered up, and internal power supply voltage VDDP generated according to this external power supply voltage EXVDD becomes stable at a predetermined voltage level. At this time, output power supply voltage VDDQ is not supplied yet. In this state, power-on detection signal ZPORQ accordingly is at L level corresponding to the ground voltage level.

When there is generated internal power supply voltage VDDP while output power supply voltage VDDQ is not supplied, output signals from gate circuit 24 and inverter 18e both are at L level of the ground voltage level and MOS transistors 18c and 18d in level conversion circuit 18 are both in OFF state. Therefore, in this state, if the level of internal power supply voltage VDDP increases, the voltage level on internal node NI in level conversion circuit 18 would be floated up to an intermediate voltage level. When the voltage level on internal node NI is floated up, a through-current flows in inverter buffer 20. Moreover, if the voltage level of internal signal BUFIN reaches an intermediate voltage level, malfunction would occur in internal circuitry.

The latch circuit constituted of inverter buffer 20 and inverter 26 is used to initialize the voltage level on internal node NI to H or L level. Therefore, such a situation can be reliably prevented that the voltage level on internal node NI increases to an intermediate voltage level upon power up of power supply voltage VDDP to cause a through-current to flow in inverter buffer 20. In addition, malfunction of circuitry in a subsequent stage is avoided due to entry of internal signal BUFIN into an unstable state of an intermediate voltage level.

When output power supply voltage VDDQ is supplied and is increased to be stabilized in voltage level, power-on detection signal ZPORQ rises to H level. At this time, according to the voltage level of external signal EXS, the logic levels of the output signals from gate circuit 24 and inverter 18e are determined. Therefore, the output signal from level conversion circuit 18 is determined according to the output signals from gate circuit 24 and inverter 18e.

Power-on detection signal ZPORQ is supplied to gate circuit 24 and the output signal of gate circuit 24 is surely set at L level when output power supply voltage VDDQ is not supplied. Thus, a through current flowing in level conversion circuit 18 can surely be prevented, this through current being caused if the voltage level of the output node increases and MOS transistor 18c in level conversion circuit 18 enters ON state. In addition, the voltage level of internal node NI is initialized to H or L level by means of the latch circuit constituted of inverter buffer 20 and inverter 26. It is accordingly possible to prevent the through current flowing in inverter buffer 20 as well as malfunction of circuitry in a subsequent stage due to unstable voltage level of internal signal BUFIN.

As shown in FIG. 7, a transfer gate (N channel MOS transistor) 18f may be provided between internal node NI and the output node of gate circuit 24, and transfer gate 18f receives, at its gate, peripheral power supply voltage VDDP. Transfer gate 18f is made ON when the level of peripheral power supply voltage VDDP increases to couple internal node NI and the output node of gate circuit 24. When output power supply voltage VDDQ is not supplied, the output signal from gate circuit 24 is at L level. Thus, internal node NI can be initialized to the ground voltage level. The initial state of level conversion circuit 18 can thus be set surely to the state in which internal node NI is at L level.

Transfer gate 18f receives the peripheral power supply voltage VDDQ at a gate thereof In a normal operation, if peripheral power supply voltage VDDP is lower than output power supply voltage VDDQ and the output signal from gate circuit 24 is at H level, transfer gate 18f serves as a decoupling transistor, to prevent output power supply voltage VDDQ from being transmitted to internal node NI. On the contrary, if peripheral power supply voltage VDDP is higher than output power supply voltage VDDQ, generally, output power supply voltage VDDQ is set to 1.8 V and peripheral power supply voltage VDDP is set to 2.5 V which is the same as the level of external power supply voltage EXVDD. When the output signal from gate circuit 24 is at H level, the gate-source voltage of this transfer gate 18f is nearly equal to the threshold voltage thereof and transfer gate 18f is in a substantially OFF state. Therefore, no adverse influence is exerted on the level conversion by level conversion circuit 18.

In addition, when the output signal from gate circuit 24 is at L level, the voltage level on internal node NI is at the ground voltage level, which causes no problem.

As heretofore described, according to the fourth embodiment of the present invention, the output node of lever conversion circuit 18 is initialized by the latch circuit having a relatively low latching ability, so that the through current flowing in level conversion circuit 18 can be suppressed. Moreover, the output signal from the level conversion circuit is set at H or L level, so that the through current flowing in inverter buffer 20 can be suppressed. Moreover, internal signal BUFIN can be prevented from being kept at an unstable voltage level, which accordingly prevents any malfunction of circuitry in a subsequent stage.

Here, the current driving ability of inverter 26 as well as the latching ability of the latch circuit formed of inverter buffer 20 and inverter 26 are made low enough, for the purpose of allowing the output signal from level conversion circuit 18 to surely change speedily according to the output signals from gate circuit 24 and inverter 18e.

Fifth Embodiment

Figure 9:
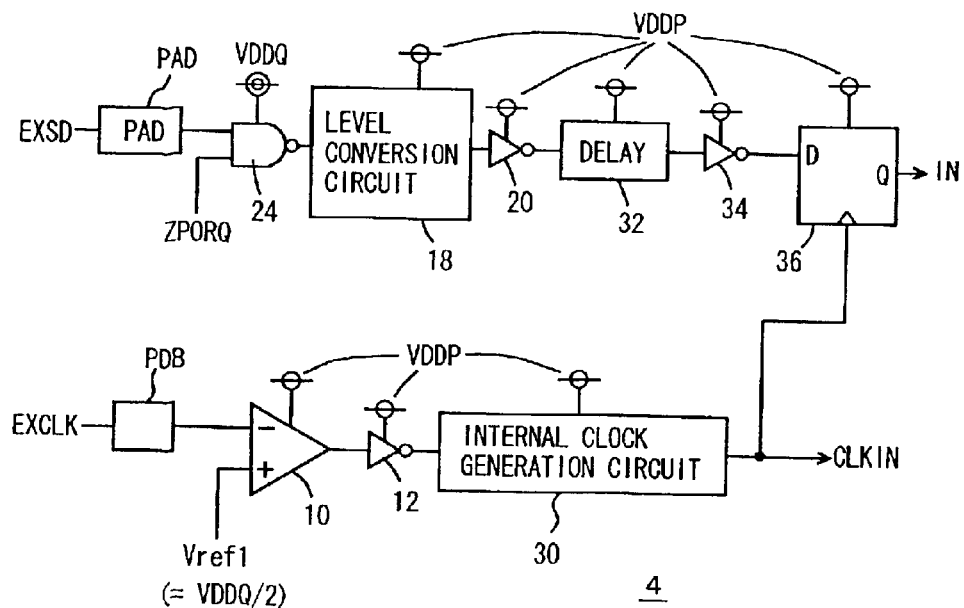
FIG. 9 schematically shows a configuration of an input circuit according to a fifth embodiment of the present invention.

FIG. 9 schematically shows a configuration of an input circuit according to a fifth embodiment of the present invention. In the configuration shown in FIG. 9, a clock input circuit 4 generating internal clock signal CLKIN according to externally supplied clock signal EXCLK, a signal input buffer circuit 5 and a data input buffer circuit 6 (see FIG. 1), are formed into different configurations according to characteristics of respective input signals.

Clock input circuit 4 includes a comparison circuit 10 receiving external clock signal EXCLK applied via a pad PDB and reference voltage Vref1, an inverter buffer 12 buffering (amplifying) an output signal from comparison circuit 10, and an internal clock generation circuit 30 according to the output signal from inverter buffer 12 to generate internal clock CLKIN in the form of a pulse signal having a predetermined time duration. These comparison circuit 10, inverter buffer 12 and internal clock generation circuit 30 receive internal power supply voltage VDDP as their operating power supply voltage. Internal clock signal CLKIN determines the timing of an internal circuit operation as well as the timing at which a signal from external circuitry is taken in. It is thus necessary that internal clock signal CLKIN is driven to a definite state as fast as possible, and therefore, comparison circuit 10, rather than a level conversion circuit having a relatively long delay time, is employed in order to generate internal clock signal CLKIN at a high speed.

On the other hand, for external address signals, commands and input data, a delay circuit is usually employed for ensuring a setup time and a hold time with respect to this internal clock signal CLKIN. Thus, it is not particularly required to generate internal signals corresponding to those external address signals, commands and input data at such a high speed as is required for internal clock signal CLKIN. Therefore, for these address signals, commands and input data bits, a level conversion circuit 18 is employed. Referring to FIG. 9, the address signals, commands and input data bits are represented by reference symbol EXSD.

The signal input buffer circuits each include a gate circuit 24 receiving external signal EXSD applied via a pad PDA and power-on detection signal ZPORQ, level conversion circuit 18 converting the level of an output signal from gate circuit 24, an inverter buffer 20 buffering the output signal from level conversion circuit 18 to output a resultant signal, a delay circuit 32 delaying by a predetermined time the output signal from inverter buffer 20, an inverter buffer 34 buffering the output signal from delay circuit 32, and a latch circuit 36 taking in and latching the output signal from inverter buffer 34 in response to rising of internal clock signal CLKIN. Delay circuit 32 is constituted of an inverter having a relatively low driving ability and thus delay circuit 32 has the low driving ability. Accordingly, inverter buffer 34 can speedily transmit the internal signal to latch circuit 36. Delay circuit 32 adjusts a setup time and a hold time of external signal EXSD with respect to internal clock signal CLKIN. Here, level conversion circuit 18 is used for converting external signal EXSD to a signal of amplitude of the level of internal power supply voltage VDDP. However, no influence is exerted by a delay time in this level conversion.

Comparison circuit 10 is constituted of a differential amplifier circuit and thus consumes a greater amount of current than that consumed by gate circuit 24 due to its differential amplifying operation (current always flowing in a normal operation mode). Therefore, the total current consumed by the entire input circuitry can be reduced by utilizing this comparison circuit including the differential amplifier circuit for constituting the input buffer circuit for external clock signal EXCLK requiring a fast response while employing gate circuit 24 for address signals, input data and commands not requiring such a quick response. In this way, the current consumption in the signal input circuitry and thus in the whole semiconductor device can be reduced.

In the arrangement shown in FIG. 9, gate circuit 24 is used to receive the power-on detection signal and external signal EXSD. However, in place of gate circuit 24, a CMOS inverter buffer circuit may be used that receives external signal EXSD only. In addition, an inverter having a relatively low driving ability may be so arranged together with inverter buffer 20 as to constitute a latch circuit as shown in FIG. 7.

According to the fifth embodiment of the invention as described above, for the external clock signal for which a high-speed response is required, the input buffer circuit including the comparison circuit formed of the differential amplifier is employed, and, for the external signals for which the high-speed response is unnecessary, the gate circuit is employed. In this way, without deterioration in the operating speed of the semiconductor device, the current consumed by the whole input circuitry can be reduced.

Sixth Embodiment

Figure 10:
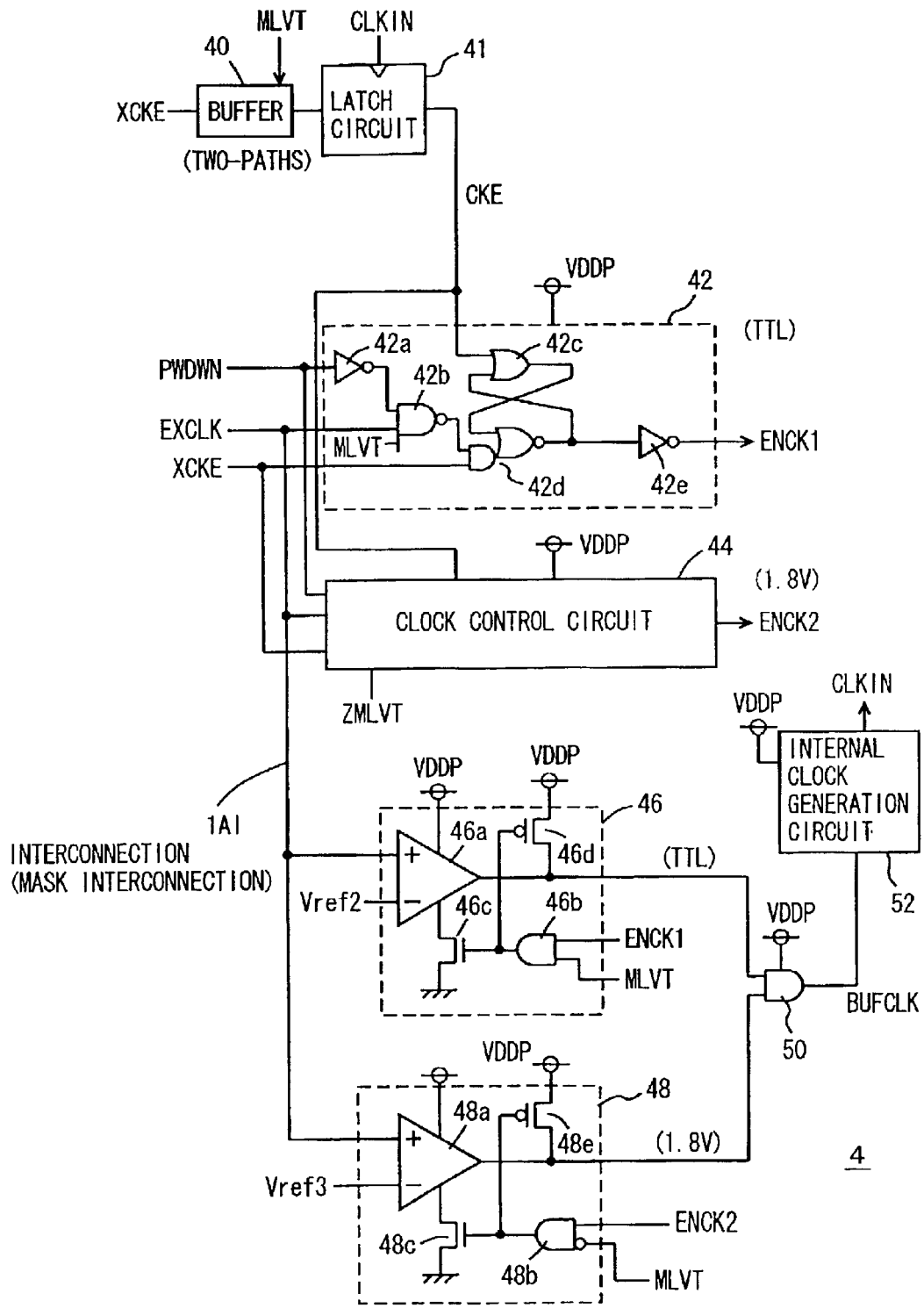
FIG. 10 shows a configuration of an input circuit according to a sixth embodiment of the present invention.

FIG. 10 schematically shows a configuration of an input circuit according to a sixth embodiment of the present invention. In the configuration shown in FIG. 10, a dock input circuit 4 for generating an internal clock signal includes a clock buffer circuit 46 for an (LV)TTL interface and a clock buffer circuit 48 for a 1.8V interface. Clock buffer circuit 46 includes a comparison circuit 46a formed of a differential amplifier receiving reference voltage Vref2 and external clock signal EXCLK, an AND circuit 46b receiving clock enable signal ENCK1 and mode select signal MLVT, an N channel MOS transistor 46c turned on, when an output signal from AND circuit 46b is at H level, to activate comparison circuit 46a, and a P channel MOS transistor 46d turned on, when the output signal from AND circuit 46b is at L level, to precharge an output node of comparison circuit 46a to the level of internal power supply voltage VDDP.

Reference voltage Vref2 is set, in compliance with the TTL interface, at the voltage level of 1.4 V, for example.

Here, the TTL interface has input HIGH level voltage VIH of 2.5 V and input LOW level voltage VIL of 0.8 V.

Clock buffer circuit 48 includes a comparison circuit 48a receiving external clock signal EXCLK and reference voltage Vref3, a gate circuit 48b receiving clock control signal ENCK2 and mode select signal MLVT, an N channel MOS transistor 48c turned on, when an output signal from gate circuit 48b is at H level, to activate comparison circuit 48a, and a P channel MOS transistor 48e turned on, when the output signal from gate circuit 48b is at L level, to charge an output node of comparison circuit 48a to the level of internal power supply voltage VDDP.

Gate circuit 48b outputs a signal of H level when mode select signal MLVT is at L level and clock control signal ENCK2 is at H level. Reference voltage Vref3 is set, in compliance with the 1.8V interface, to the voltage level at a half of output power supply voltage VDDQ. In other words, reference voltage Vref3 has a voltage level depending on output power supply voltage VDDQ. However, according to this embodiment, reference voltage Vref3 may be set at a constant voltage level (e.g. 0.9 V) independent of output power supply voltage VDDQ. Here, the 1.8V interface has input HIGH level voltage VIH of 0.8·VDDQ and input LOW level voltage VIL of 0.2·VDDQ as described above.

Clock input circuit 4 further includes an AND circuit 50 receiving the output signals from clock buffer circuits 46 and 48 and an internal clock generation circuit 52 to generate internal clock signal CLKIN in accordance with an output signal from AND circuit 50. These AND circuit 50 and internal clock generation circuit 52 receive peripheral power supply voltage VDDP as their operating power supply voltage.

Mode select signal MLVT is set at H or L level according to whether the interface is the 1.8V interface or the (LV)TTL interface. In the TTL (LVTTL) mode, mode select signal MLVT is fixed at H level so that clock buffer circuit 46 is enabled. On the other hand, clock buffer circuit 48 has the operation of generating the internal clock stopped since the output signal from gate circuit 48b is at L level and MOS transistor 48c is in OFF state.

When the interface is 1.8V interface, mode select signal MLVT is set at L level. Therefore, clock buffer circuit 46 has the operation of generating the internal clock stopped since the output signal from AND circuit 46b is at L level and MOS transistor 46c is in OFF state. In clock buffer circuit 48, the output signal from gate circuit 48b is at L level so that MOS transistor 48c is selectively turned on according to clock control signal ENCK2 and comparison circuit 48a performs the clock generating operation.

When clock buffers 46 and 48 are not activated, the output nodes thereof are set at the level of internal power supply voltage VDDP by MOS transistors 46d and 48e, respectively. Then, AND circuit 50 generates buffer clock signal BUFCLK in accordance with the output signal from activated clock buffer circuit 46 or 48. Internal clock generation circuit 52 generates internal clock signal CLKIN having a predetermined pulse width according to this buffer clock signal BUFCLK.

As shown in FIG. 10, clock buffer circuits 46 and 48 are provided for the TTL (LVTTL) interface and 1.8V interface, respectively, and these buffer circuits are selectively activated according to the interface that is practically employed. Therefore, regardless of whether the interface is 1.8V interface or TTL (LVTTL) interface, the internal clock signal can readily be generated without changing a circuit configuration.

Clock control circuits 42 and 44 are provided for controlling the operations of respective clock buffer circuits 46 and 48. Clock control circuits 42 and 44 have the same configuration and FIG. 10 shows the configuration of clock control circuit 42, representatively.

Referring to FIG. 10, clock control circuit 42 includes an inverter 42a receiving power-down instruction signal PWDWN, a NAND circuit 42b receiving an output signal from inverter 42a, external clock signal EXCLK and mode select signal MLVT, an OR gate 42c and a composite gate 42d constituting a flip-flop, and an inverter 42e buffering an output signal from composite gate 42d to generate clock control signal ENCK1.

OR gate 42c receives internal clock enable signal CKE from a latch circuit 41 and the output signal from composite gate 42d. Composite gate 42d includes equivalently an AND gate which receives an output signal from NAND circuit 42b and external clock enable signal XCKE and an NOR gate which receives the output signals from the AND gate and NOR gate 42c.

Latch circuit 41 takes in and latches a buffer clock enable signal applied from a buffer 40, when internal clock signal CLKIN rises, to generate internal clock enable signal CKE.

Buffer 40 includes a gate circuit 24, a level conversion circuit 18, an inverter buffer 20 and an inverter buffer 34 as shown in FIG. 9. Specifically, buffer 40 receives external clock enable signal XCKE at the gate circuit receiving the output power supply voltage as its operating power supply voltage. Buffer 40 includes two circuit paths, one of which is used according to an interface employed. Thus, one of the two buffer circuit paths is activated according to mode select signal MLVT depending on the employed interface.

Internal clock enable signal CKE from latch circuit 41 is commonly applied to clock control circuits 42 and 44. Accordingly, regardless of whether the employed interface is 1.8V interface or TTL (LVTTL) interface, internal clock enable signal CKE can accurately be generated from external clock enable signal XCKE. Moreover, latch circuit 41 is shared by the 1.8V interface circuitry and TTL (LVTTL) interface circuitry to reduce the circuit occupying area.

Clock control circuit 44 receives an inverted signal ZMLVT of mode select signal MLVT. In these clock control circuits 42 and 44, the specification of NAND circuit 42b is optimized to be adapted to the corresponding interface. In other words, in clock control circuit 42, NAND circuit 42b has the criterion of determining H level/L level of external clock signal XCLK set to the voltage of 1.4 V. On the other hand, in clock control circuit 44, the intermediate value of H level/L level of external clock signal XCLK is set to be 0.9 V. This is accomplished by adjusting the sizes of transistors (ratio adjustment).

In this way, clock control circuits 42 and 44 for generating clock control signals ENCK1 and ENCK2 are provided separately and compliant to the respective interfaces to be employed, and the optimum circuit configuration can be implemented according to the respective interfaces. In addition, according to the interface that is actually employed, one of clock control circuits 42 and 44 is selectively activated. Therefore, any of the 1.8V interface and TTL (LVTTL) interface can be satisfactory accommodated for.

Figure 11:
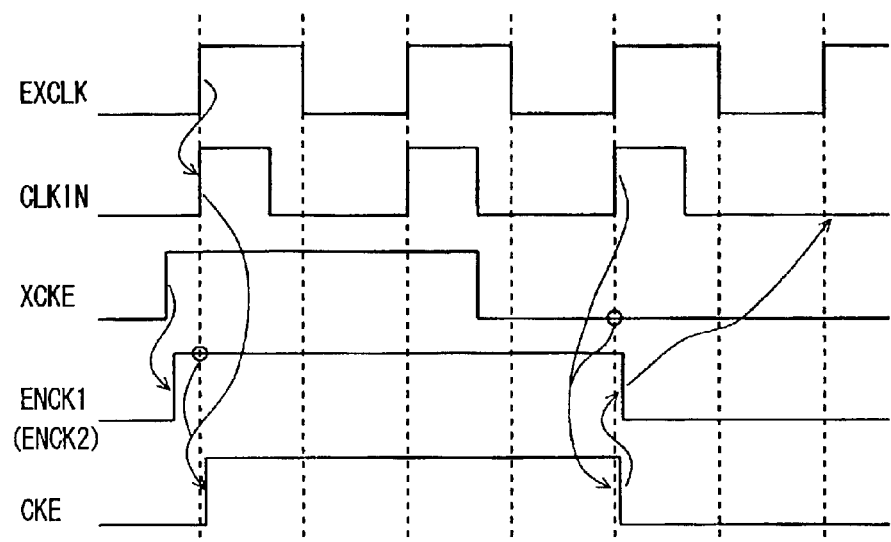
FIG. 11 is a signal waveform diagram representing an operation of a clock control circuit shown in FIG. 10.

FIG. 11 is a signal waveform diagram representing an operation of clock control circuits 42 and 44 shown in FIG. 10. The operation of clock control circuits 42 and 44 is now described with reference to FIG. 11.

Buffer 40 includes two buffer circuit paths. In other words, two input buffer circuit paths are provided respectively for the TTL interface and the 1.8V interface, and one of the two paths is activated according to mode select signal MLVT. In this input buffer circuit, a gate circuit in the first input stage is optimized according to the interface of the output power supply voltage VDDQ, and the input buffer circuit receives internal power supply voltage VDDP as its operating power supply voltage.

In response to rising of internal clock signal CLKIN, latch circuit 41 takes in an output signal from buffer 40 to generate internal clock enable signal CKE. Now, the case is considered in which power down instruction signal PWDWN is set at L level. Then, the output signal from inverter 42a is at H level. When mode select signal MLVT is at H level, in clock control circuit 42, NAND circuit 42b is enabled to invert external clock signal EXCLK and output the resultant signal.

It is assumed that clock control signal ENCK1 is set at L level according to external clock enable signal XCKE and the operation of generating the internal clock signal is stopped. In this state, if external clock enable signal XCKE rises to H level and external clock signal XCLK is at L level, the output signal from composite gate 42d is at L level and clock control signal ENCK1 rises to H level.

When clock control signal ENCK1 rises to H level, in clock buffer circuit 46, MOS transistor 46c is turned on while MOS transistor 46d is turned off, and comparison circuit 46a is activated to generate the internal clock signal in response to rising of external clock signal EXCLK. Accordingly, buffer clock signal BUFCLK from AND circuit 50 changes. Here, the output signal from clock buffer circuit 48 is kept at H level when the mode select signal is at H level and thus AND circuit 50 operates as a buffer circuit.

In response to rising of buffer clock signal BUFCLK, internal clock generation circuit 52 generates internal clock signal CLKIN. When internal clock signal CLKIN rises to H level or is generated, latch circuit 41 takes in external clock enable signal XCKE from buffer 40 and internal clock enable signal CKE is set at H level. When internal clock signal CKE rises to H level, the output signal from OR gate 42c of clock buffer circuit 42 attains H level, the output signal from composite gate 42d is kept at L level, and clock control signal ENCK1 is maintained at H level.

In the following clock cycle, even if external clock enable signal XCKE falls to L level, the output signal from OR gate 42c is still at H level and clock control signal ENCK1 maintains H level. Clock control signal ENCK1 is at H level. Therefore, when internal clock signal CLKIN is generated and internal clock enable signal CKE attains L level, the output signal from NOR gate 42c attains L level, the output signal from composite gate 42d attains H level, and clock control signal ENCK1 attains L level.

When this clock control signal ENCK1 is at L level, the operation of generating the internal clock by clock buffer circuit 46 is stopped. Internal clock generation circuit 52 generates the internal clock signal having a predetermined pulse width in response to rising of buffer clock signal BUFCLK applied from AND gate 50. Then, after clock enable signal CKE falls to L level, the operation of generating internal clock signal CLKIN in the following clock cycle is stopped.

External clock enable signal XCKE is set at H level before external clock signal EXCLK rises, to activate clock control signal ENCK1 for activating clock buffer circuit 46. Accordingly, the operation of the clock buffer circuit can be stopped when external clock enable signal XCKE is at L level to reduce current consumption. Further, the internal clock signal can be generated in a current clock cycle according to external clock enable signal XCKE.

For clock buffer circuits 46 and 48 shown in FIG. 10, mode select signal MLVT is fixedly generated by setting a specific bonding pad at a predetermined voltage level. Alternatively, instead of AND gate 46b and gate circuit 48b, metal switches may be employed to fixedly couple the gates of MOS transistors 46c and 48c to receive either of the ground voltage and the corresponding clock control signal by means of mask interconnection.

Clock control circuit 44 and clock buffer circuit 48 are allowed to operate when mode select signal MLVT is set at L level to operate similarly to clock control circuit 42 and clock buffer circuit 46 as described above.

A clock transmission line transmitting external clock signal EXCLK to clock control circuits 42 and 44 and clock buffer circuits 46 and 48 are formed of a first level aluminum interconnection line for example, in order to transmit external clock signal EXCLK to only the clock control circuit and clock buffer circuit that are actually used. In this way, the load on clock signal lines transmitting external clock signal EXCLK can be reduced and external clock signal EXCLK is accordingly transmitted speedily.

When power down instruction signal PWDWN is at H level, the output signal from inverter 42a is at L level and the output signal from NAND circuit 42b is fixed at H level. At this time, external clock enable signal XCKE is fixed at L level to set clock control signal ENCK1 at L level, so that the operation of the corresponding clock buffer circuit can be stopped. Thus, current consumed in the power down mode can be reduced.

In clock control circuit 44 for the 1.8V interface, a gate can be used in the first stage that receives output power supply voltage VDDQ as its operating power supply voltage as described in connection with the ninth embodiment.

Figure 12:
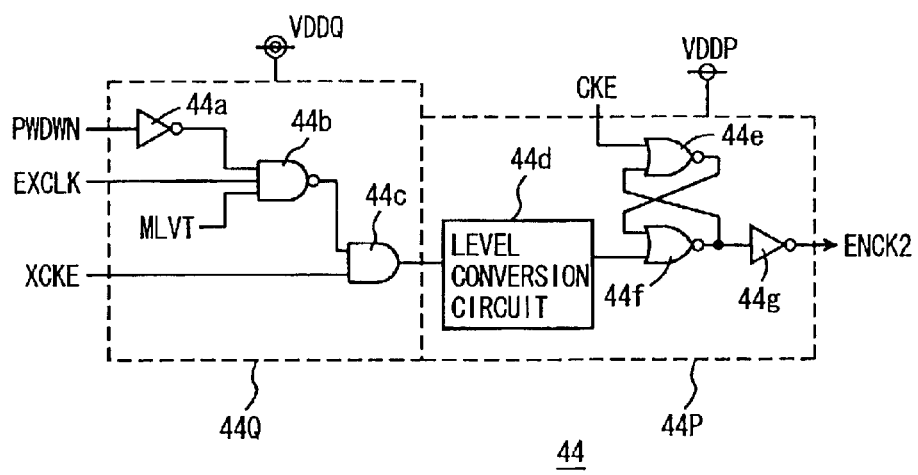
FIG. 12 schematically shows a configuration of a modification of the sixth embodiment of the invention.

FIG. 12 schematically shows a configuration of clock control circuit 44 for the 1.8V interface. Referring to FIG. 12, clock control circuit 44 includes an output power supply circuit section 44Q receiving output power supply voltage VDDQ and a peripheral power supply circuit section 44P receiving internal power supply voltage VDDP as its operating power supply voltage.

Output power supply circuit section 44Q includes an inverter 44a receiving power down instruction signal PWDWN, a NAND gate 44b receiving an output signal from inverter 44a, external clock signal EXCLK and mode select signal MLVT, and an AND gate 44c receiving an output signal from NAND gate 44b and external clock enable signal XCKE. These inverter 44a, NAND gate 44b and AND gate 44c receive output power supply voltage VDDQ as their operating power supply voltage.

Peripheral power supply circuit section 44P includes a level conversion circuit 44d converting an output signal from AND circuit 44c into a signal having an amplitude of internal power supply voltage VDDP, an OR gate 44e and an NOR gate 44f constituting a flip-flop, and an inverter 44g inverting an output signal from NOR gate 44f to generate clock control signal ENCK2. These level conversion circuit 44d, OR gate 44e, NOR gate 44f, and inverter 44g receive internal power supply voltage VDDP as their operating power supply voltage.

The reason why level conversion circuit 44d is employed is that external power supply voltage EXVDD higher than output power supply voltage VDDQ is used as peripheral power supply voltage VDDP in 1.8 V interface.

In this clock control circuit 44 associated with the 1.8V interface, the gate circuit receiving an external signal is supplied with output power supply voltage VDDQ as the operating power supply voltage, so that the internal signal can precisely be generated even if this output power supply voltage VDDQ varies.

Figure 13:
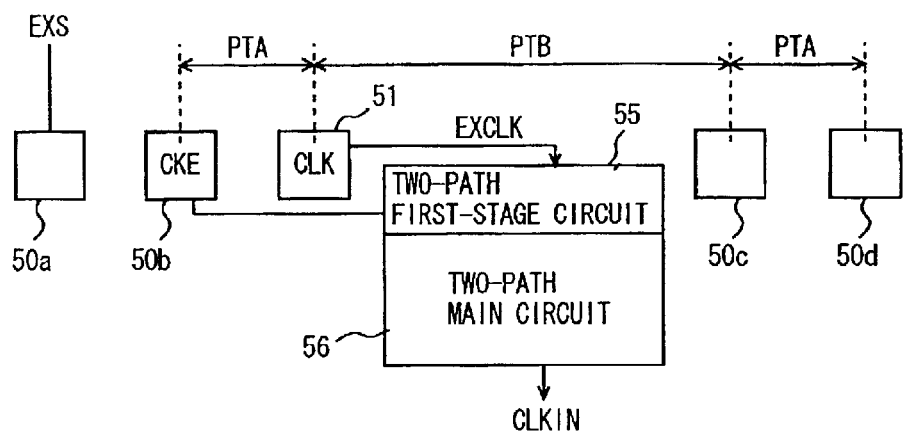
FIG. 13 schematically shows an arrangement of clock input circuitry according to the sixth embodiment of the invention.

FIG. 13 schematically shows an arrangement of a clock input circuit. Referring to FIG. 13, pads 50a–50d and a clock input pad 51 are arranged. The pitch between pads 50a and 50b, the pitch between pads 50b and 50c and the pitch between pads 50c and 50d are each set to a predetermined pitch PTA. The pitch between pad 51 to which the clock signal is input and pad 50c adjacent to pad 51 is set to a pitch PTB longer than pitch PTA.

Between the clock input pad 51 and pad 50c to which other signals/data is input, a first-stage circuit 55 of two paths is provided that includes the first stage circuits of the clock control circuit and clock buffer circuits. Two-path circuits include 1.8V interface circuit and TTL (LVTTL) interface circuit. Adjacent to two-path first-stage circuit 55, main circuitry of clock control circuits 42 and 44 and clock input buffers 46 and 48 (circuits in the following and downstream stages) is provided. The two-path main circuitry generates internal clock signal CLKIN.

Two-path first-stage circuit 55 includes NAND gates 42b and 44b as well as comparison circuits 46a and 48a (not shown) receiving external clock signal EXCLK, which are shown in FIG. 10. The two-path main circuitry 56 includes remaining circuit components of clock control circuits 42 and 44 and clock input buffers 46 and 48.

The pitch for clock input pad 51 is made longer than those for other pads to place two-path first-stage circuit 55 closer to clock input pad 51. In this way, the signal route for transmitting external clock signal EXCLK can be made shorter and thus clock signal EXCLK can speedily be transmitted to a plurality of gate circuits.

In FIG. 13, two-path first-stage circuit 55 is provided in the region between clock input pad 51 and pad 50c. However, since the two-path first-stage circuit 55 is merely required to be placed near clock input pad 51, the first-stage circuit 55 may be placed in the vicinity of and facing to clock enable pad 50b receiving external clock enable signal CKE and clock input pad 51.

In other words, the clock control circuit receiving clock enable signal CKE is provided near clock enable signal input pad 50b and the clock input buffer generating the internal clock signal according to external clock signal CLK and the clock control signal is provided near clock input pad 51. In this case, with respect to clock input buffer 51, the clock input buffer and the clock control circuit are symmetrically arranged, so that the same time is consumed for propagation of external clock signal EXCLK to the clock input buffer and the clock control circuit and accordingly the clock signal can be transmitted quickly to the first stage gate circuits.

Figure 14:
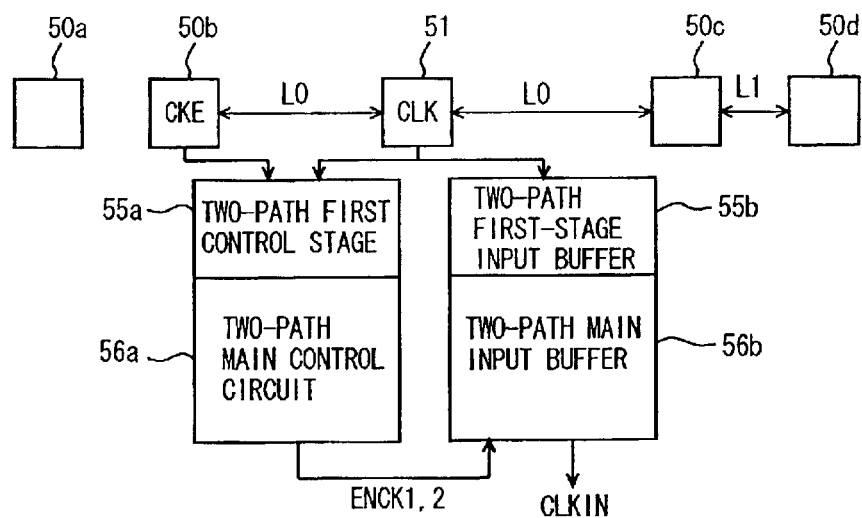
FIG. 14 shows a modification of the arrangement in the clock input circuit according to the sixth embodiment of the invention.

Specifically, referring to FIG. 14, it is assumed that the distance between clock input pad 51 and clock enable input pad 50b is L0 and the distance between clock input pad 51 and input pad 50c receiving another signal is also L0. The normal distance between pads is L1. Adjacent to clock input pad 50b and clock input pad 51, a first control stage 55a of two paths for two interface systems of the 1.8V interface and TTL interface. The first control stage is hereinafter referred to as two-path first control stage. The first control stage 55a is gates receiving the external signals of the clock control circuits Adjacent to the two-path first control stage 55a, a two-path main control circuit 56a is provided for generating respective control signals ENCK1 and ENCK2 for the 1.8V interface and TTL interface.

In the region between clock input pad 51 and another pad 50c, a two-path first-stage input buffer 55b is provided. Two-path first-stage input buffer 55b includes a comparison circuit receiving a reference voltage and external clock signal EXCLK. Adjacent to the two-path first-stage input buffer 55b, a two-path main input buffer circuit 56b is provided for generating internal clock signal CLKIN according to clock control signals ENCK1 and ENCK2.

According to the arrangement shown in FIG. 14, the distance between the two-path first control stage 55a and clock input pad 51 and the distance between two-path first-stage input buffer 55b and clock input pad 51 can be made substantially equal to each other. Thus, the clock signal can be transmitted to these circuits with the same propagation delay, and internal clock signal CLKIN and clock control signals ENCK1 and ENCK2 can be generated at a precise timing.

As discussed above, according to the sixth embodiment of the present invention, the circuit configurations for generating clock signals respectively for the 1.8V interface and for the TTL interface are provided separately. Thus, it is possible to easily generate an internal clock signal having an accurate waveform without change in the circuit arrangement even if a different interface is used.

Seventh Embodiment

Figures 15A, 15B:
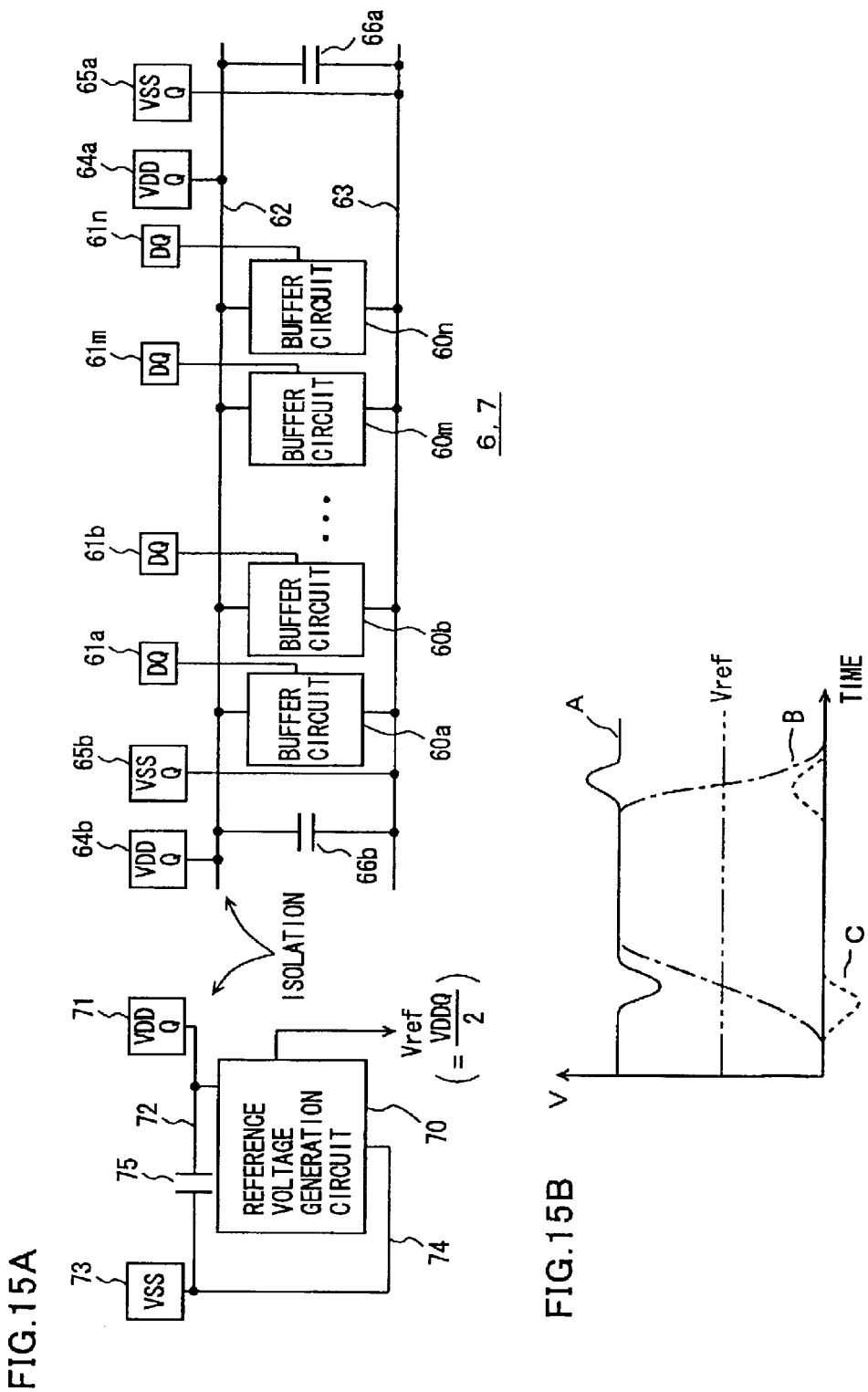
FIG. 15A schematically shows a power supply arrangement according to a seventh embodiment of the present invention.
FIG. 15B shows voltage changes when data is output under the power supply arrangement shown in FIG. 15A.

FIG. 15A schematically shows a power supply arrangement according to a seventh embodiment of the present invention. Referring to FIG. 15A, buffer circuits 60a–60n are arranged. Buffer circuits 60a–60n include circuits 4–7 that receive output power supply voltage VDDQ as the operating power supply voltage as shown in FIG. 1. However, FIG. 15A representatively shows a configuration of data input buffer circuit 6 and data output circuit 7.

Buffer circuits 60a–60n each include an input buffer circuit and an output buffer circuit. The input buffer circuit has its circuit configuration as described in connection with any of the first to sixth embodiments.

These buffer circuits 60a–60n are coupled respectively to data terminals (pads) 61a–61n for externally providing and receiving data.

Power supply voltage VDDQ of an output power supply line 62 and ground voltage VSSQ of an output ground line 63 are commonly supplied as one and the other operating power supply voltages to buffer circuits 60a–60n. Output power supply line 62 is coupled to pads 64a and 64b for transmitting externally supplied output power supply voltage VDDQ. Output ground line 63 transmits output ground voltage VSSQ which is externally supplied via pads 65a and 65b.

Decoupling capacitors 66a and 66b for voltage stabilization are connected between output power supply line 62 and output ground line 63.

A reference voltage generation circuit 70 generates a reference voltage Vref having a voltage level at a half of the level of output power supply voltage VDDQ, and receives its operating power supply voltage from a power supply line 72 and a ground line 74 that are arranged separately from output power supply line 62 and output ground line 63. Power supply line 72 is coupled to a pad 71 for transmitting externally supplied output power supply voltage VDDQ and ground line 74 is coupled to a pad 73 for transmitting externally supplied ground voltage VSS.

A decoupling capacitor 75 is connected between power supply line 72 and ground line 74. Ground line 74 commonly transmits ground voltage VSS to internal circuits.

Output power supply line 62 and power supply line 72 receive external output power supply voltage VDDQ from different pads 64a, 64b and 71, respectively. Output ground line 63 and ground line 74 receive ground voltages VSSQ and VSS from different pads 65a, 65b and 73, respectively.

Thus, output power supply line 62 and power supply line 72 are isolated from each other AC-wise or in the sense of alternating current and output ground line 63 and ground line 74 are isolated from each other in terms of alternating current. In particular, ground line 74 and output ground line 63 receive respective ground voltages via different pin terminals and thus the ground lines are electrically isolated from each other.

FIG. 15B shows changes in the voltage levels of the output power supply line and the output ground line in a case when buffer circuits 60a–60n shown in FIG. 15A operate. Referring to FIG. 15B, curve A represents a voltage change of output power supply line 62 and curve C represents a voltage change of output ground line 63. Curve B represents a voltage change on an output terminal (pad). Description is given below, with reference to FIG. 15B, of the voltage changes of output power supply line 62 and output ground line 63 in a case when the buffer circuits shown in FIG. 15A output data.

It is assumed that buffer circuits 60a–60n simultaneously operate to output data. In this state, data terminals 61a–61n are driven according to output data and accordingly output power supply voltage VDDQ of output power supply line 62 is consumed.

When the output data is H data and the voltage level on a corresponding data terminal rises, current flows from output power supply line 62 to that corresponding data output terminal. Thus, output power supply voltage VDDQ of output power supply line 62 is consumed and accordingly decreases. The decrease in the voltage level of output power supply line 62 is transmitted via decoupling capacitors 66a and 66b to output ground line 63, and accordingly the voltage level of output ground line 63 lowers.

When the output data is L data and a corresponding data terminal is driven to L level, current flows from an output node to output ground line 63, so that the voltage level of output ground line 63 increases. The increase of the voltage level of output ground line 63 is transmitted via decoupling capacitors 66a and 66b to output power supply line 62, and accordingly the voltage level of output power supply line 62 rises.

Since buffer circuits 60a–60n simultaneously operate for outputting data, the voltage levels of output power supply line 62 and output ground line 63 remarkably change depending on the pattern of output data.

When such a data-output operation is carried out, a high power-supply noise occurs and the noise changes abruptly since multi-bit data is output at a high speed. Moreover, the noise has various frequency components which cannot be eliminated even by means of the decoupling capacitors or low-pass filters.

As for this data-output operation, there is a case where the data output operation and a data writing operation are alternately carried out. In such a case, if output power supply voltage VDDQ and output ground voltage VSSQ that significantly change are used to generate reference voltage Vref1, the level of the reference voltage changes according to the internal data output operation even if the externally supplied output power supply voltage has a constant level. Consequently, it becomes impossible to accurately determine the logic level of an input signal. To a circuit which generates the input signal, any change of the output power supply voltage in this semiconductor memory device is not transmitted. Therefore, the voltage level of the input signal is constant independently of the output operation of the semiconductor memory device. This is because that a power supply terminal of the semiconductor memory device is associated with a large parasitic capacitance and thus the power supply noise of the semiconductor memory device is not transmitted to the external circuit which generates the input signal.

As shown in FIG. 15A, power supply line 72 for reference voltage generation circuit 70 is isolated from output power supply line 62 in terms of alternating current. Therefore, even if the buffer circuits 60a–60n operate to cause output power supply voltage VDDQ on output power supply line 62 to vary, power supply voltage VDDQ for reference voltage generation circuit 70 can be maintained at a constant level without being affected by the variation of the voltage of output power supply line 62. In addition, as output ground line 63 and ground line 74 are isolated from each other so that any change of the voltage of output ground line 63 is not transmitted to ground line 74. In this way, reference voltage Vref of a constant level can stably be generated by reference voltage generation circuit 70 as shown in FIG. 15B.

Further, decoupling capacitor 75 connected between power supply line 72 and ground line 74 serves to absorb any voltage change of power supply line 72, so that power supply voltage VDDQ of power supply line 72 can be maintained at a constant level in a stable manner. Even if the voltage level changes through capacitive coupling between power supply line 72 and ground line 74 by decoupling capacitor 75, the difference between power supply voltage VDDQ of power supply line 72 and ground voltage VSS of ground line 74 is kept constant. Reference voltage Vref is at the voltage level of (VDDQ-VSS)/2. Therefore, reference voltage Vref at a constant level can be generated without being affected by voltage changes. Thus, even if the output power supply voltage and/or output ground voltage change due to an internal operation, reference voltage Vref having a constant level can stably be generated without being affected by such change. Consequently, the logic level of an input signal can correctly be determined.

Figure 16:
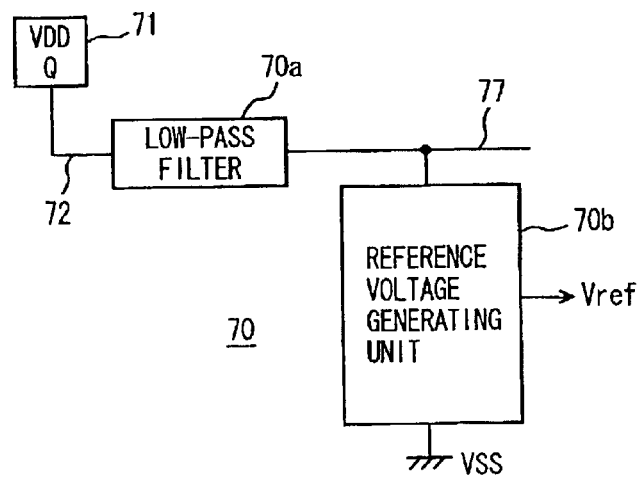
FIG. 16 schematically shows a configuration of a reference voltage generation circuit shown in FIG. 15A.

FIG. 16 schematically shows a configuration of reference voltage generation circuit 70 shown in FIG. 15A. Referring to FIG. 16, reference voltage generation circuit 70 includes a low-pass filter 70a coupled to power supply pad 71 via power supply line 72, an internal power supply line 77 coupled to power supply line 72 via low-pass filter 70a, and a reference voltage generating section 70b for generating reference voltage Vref according to power supply voltage VDDQ on internal power supply line 77 and ground voltage VSS.

Low-pass filter 70a removes a noise component of power supply line 72 to transmit a stable power supply voltage to internal power supply line 77. Accordingly, even if there is a variation in the externally supplied power supply voltage VDDQ, low-pass filter 70a transmits a stable and constant power supply voltage to internal power supply line 77 with any changing component removed. In particular, as power supply line 72 is isolated from output power supply line 62 AC (alternate current) -wise, low-pass filter 70a merely removes a noise component of the externally supplied power supply voltage even if output power supply voltage VDDQ of output power supply line 62 varies. Low-pass filter 70a is not required to remove a great noise component of output power supply line 62. Therefore, power supply voltage VDDQ of power supply line 72 can be maintained at a stable voltage level without noise. Moreover, since output ground line 63 and ground line 74 are isolated from each other, no noise component of output ground line 63 is transmitted to ground line 74, so that the reference voltage of the level (VDDQ-VSS)/2 can be generated correctly in a stable manner.

Figure 17:
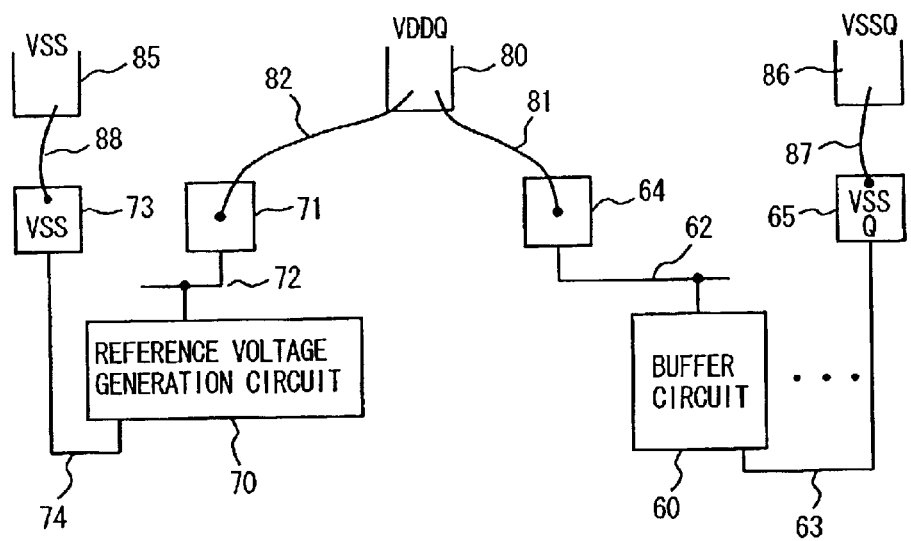
FIG. 17 schematically illustrates connections between pads and pin terminals.
Figure 18:
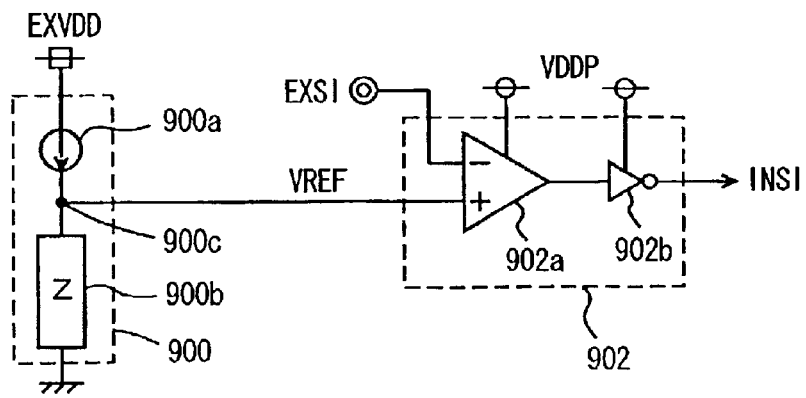
FIG. 18 schematically shows a configuration of a conventional input circuit.
Figure 19:
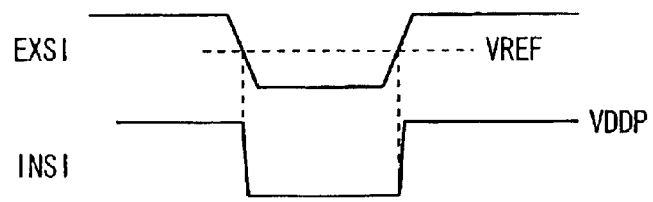
FIG. 19 is a signal waveform diagram representing an operation of the input circuit shown in FIG. 18.
Figure 20:
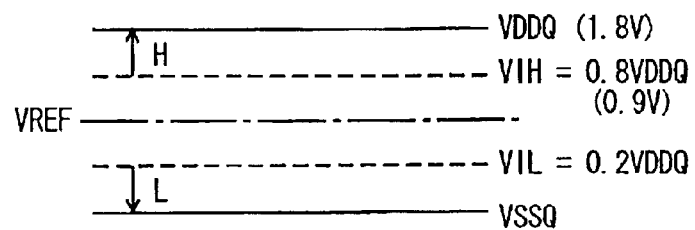
FIG. 20 shows a relation between an input signal to the input circuit shown in FIG. 18 and a reference voltage.
Figure 21A:
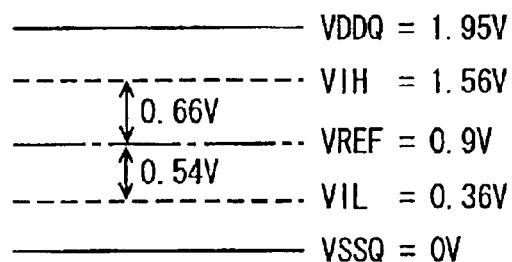
FIG. 21A schematically shows a relation between the reference voltage and the logic level of the input signal when an external power supply voltage increases.
Figure 21B:
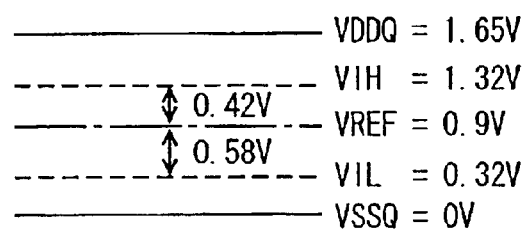
FIG. 21B shows a relation between the reference voltage and the logic level of the input signal when the external power supply voltage decreases.
Figure 22A:
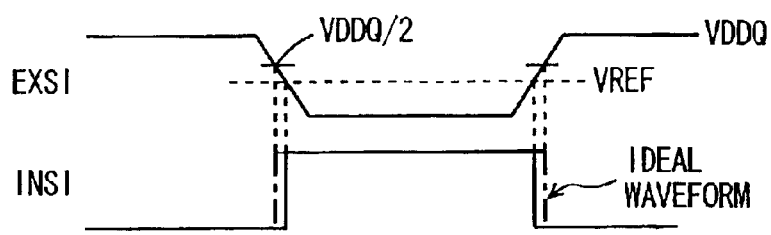
FIG. 22A schematically shows an internal signal waveform when external power supply voltage increases, and FIG. 22B schematically shows an internal signal waveform when the external power supply voltage decreases.
Figure 22B:
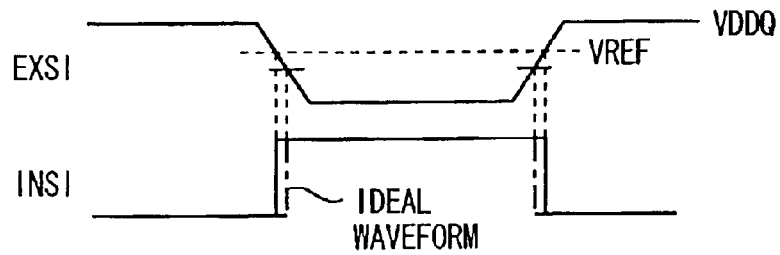

FIG. 17 schematically shows a configuration of a circuit portion for supplying power supply voltage VDDQ. Referring to FIG. 17, an output power supply pad 64 is connected to an output power supply terminal 80 via a bonding wire 81. Power supply pad 71 is connected to output power supply terminal 80 via a bonding wire 82.

Output power supply pad 64 is connected to a buffer circuit 60 via output power supply line 62. Here, buffer circuit 60 represents buffer circuits 60a–60n shown in FIG. 15A and pad 64 represents pads 64a and 64b shown in FIG. 15A.

Power supply pad 71 is coupled to reference voltage generation circuit 70 via power supply line 72. Even if these power supply pads 64 and 71 are connected to the common power supply terminal 80, bonding wires 81 and 82 each have a large parasitic capacitance and pads 81 and 71 also are associated with large parasitic capacitances. Power supply lines 81 and 82 are isolated from each other AC-wise. Therefore, any significant noise component generated on output power supply line 62 are absorbed by these parasitic capacitances. Thus, it is possible to reliably prevent a noise on output power supply line 62 from being transmitted to power supply line 72.

A ground pad 65 is connected to an output ground terminal 86 via a bonding wire 87 and a ground pad 73 is connected to a ground terminal 85 via a bonding wire 88. Output ground pad 65 represents output ground pads 65a and 65b in FIG. 15A.

Output ground terminal 86 and ground terminal 85 are separately provided, and output ground terminal 86 supplies the ground voltage dedicated to output circuitry while ground terminal 85 supplies the ground voltage VSS commonly to the internal circuits. Ground line 74 and output ground line 63 are coupled to different external ground terminals from each other and are isolated from each other. Therefore, no noise generated on output ground line 63 is transmitted to ground line 74 at all.

In this way, reference voltage Vref at a halved output power supply voltage VDDQ level can stably be generated by reference voltage generation circuit 70 even if the output buffer circuit operates to cause noise on output power supply line 62 and/or output ground line 63.

As heretofore described, according to the seventh embodiment of the present invention, the reference voltage is generated from the voltages of the power supply line and ground line AC-wise isolated from the output power supply line and output ground line that supply the operating power source voltages to output circuitry. Therefore, the reference voltage accurately at a voltage level of a halved power supply voltage can be generated. The logic level of an input signal can thus be determined correctly without being influenced by a power supply noise due to an operation of the internal circuitry.

Although the above description of the first to seventh embodiments is made for the 1.8V interface and TTL interface, the present invention is applicable to any interface if the amplitude of the external signal depends on the level of output power supply voltage in the interface.

Thus, the present invention is not limited to the circuit for the 1.8V interface. In addition, although the TTL interface is employed as an interface which is different from the 1.8V interface, another interface can be employed instead.

According to the present invention as described above, regardless of any change of the output power supply voltage which determines the amplitude of an external signal, an internal signal is generated according to the output power supply voltage and the voltage level of the external signal, and thus the internal signal can accurately be generated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

reference voltage generation circuitry configured for generating, based on a first power supply voltage supplied from a first power supply pad, a reference voltage dependent on said first power supply voltage;

a first input circuit configured for receiving a first input signal applied externally to said semiconductor device and determining a logic level of said first input signal in accordance with a relation between voltage levels of said reference voltage and said first input signal, and generating a first internal signal for an internal circuit of said semiconductor device, said first internal signal having a level of a second power supply voltage different from a level of said first power supply voltage in accordance with a result of determination; and an output circuit configured for receiving said first power supply voltage, the same as the voltage applied to said reference voltage generation circuit, as an operating power supply voltage and buffering a received signal from the internal circuit and outputting a resultant signal externally to said semiconductor device, wherein said first input circuit includes a differential amplifying circuit configured for receiving said second power supply voltage as an operating power supply voltage to operate, differentially amplifying said first input signal and said reference voltage, and generating said first internal signal in accordance with a result of differential amplification.

2. The semiconductor device according to claim 1, wherein said first input signal is a clock signal defining a timing for taking in and outputting of a signal by said semiconductor device.

3. A semiconductor device comprising:

reference voltage generation circuitry configured for generating, based on a first power supply voltage supplied from a first power supply pad, a reference voltage dependent on said first power supply voltage;

a first input circuit configured for receiving a first input signal applied externally to said semiconductor device and determining a logic level of said first input signal in accordance with a relation between voltage levels of said reference voltage and said first input signal, and generating a first internal signal for an internal circuit of said semiconductor device, said first internal signal having a level of a second power supply voltage different from a level of said first power supply voltage in accordance with a result of determination; and an output circuit configured for receiving said first power supply voltage, the same as the voltage applied to said reference voltage generation circuit, as an operation power supply voltage and buffering a received signal from the internal circuit and outputting a resultant signal externally to said semiconductor device, wherein said output circuit receives the first power supply voltage through a second pad provided separately from said first power supply pad.

* * * * *